US012641877B2

(12) United States Patent
Lin et al.

(10) Patent No.: US 12,641,877 B2
(45) Date of Patent: May 26, 2026

(54) COMPLEMENTARY FIELD-EFFECT TRANSISTOR DEVICES AND METHODS OF FORMING THE SAME

(71) Applicant: Taiwan Semiconductor Manufacturing Co., Ltd., Hsinchu (TW)

(72) Inventors: Cheng-Ming Lin, Kaohsiung City (TW); Chun-I Wu, Taipei (TW); Tsung-Kai Chiu, Zhubei (TW); Wei-Yen Woon, Taoyuan City (TW); Szuya Liao, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 374 days.

(21) Appl. No.: 18/345,467

(22) Filed: Jun. 30, 2023

(65) Prior Publication Data

US 2025/0006739 A1     Jan. 2, 2025

(51) Int. Cl.
 H10D 84/85     (2025.01)
 H10D 30/01     (2025.01)
      (Continued)

(52) U.S. Cl.
 CPC ......... H10D 84/856 (2025.01); H10D 30/014 (2025.01); H10D 30/43 (2025.01);
      (Continued)

(58) Field of Classification Search
 CPC .... H10D 84/856; H10D 30/014; H10D 30/43; H10D 30/6735; H10D 30/6739;
      (Continued)

(56) References Cited

U.S. PATENT DOCUMENTS 10,553,495 B2     2/2020     Cheng et al.
11,164,793 B2     11/2021     Xie et al.
      (Continued)

FOREIGN PATENT DOCUMENTS

TW     202135172 A     9/2021
TW     202205449 A     2/2022
      (Continued)

*Primary Examiner* — Eric W Jones
*Assistant Examiner* — Sammantha K Salaz
(74) *Attorney, Agent, or Firm* — Slater Matsil, LLP

(57)     ABSTRACT

A method of forming a complementary field-effect transistor (CFET) device includes: forming a plurality of channel regions stacked vertically over a fin; forming an isolation structure between a first subset of the plurality of channel regions and a second subset of the plurality of channel regions; forming a gate dielectric material around the plurality of channel regions and the isolation structure; forming a work function material around the gate dielectric material; forming a silicon-containing passivation layer around the work function material; after forming the silicon-containing passivation layer, removing a first portion of the silicon-containing passivation layer disposed around the first subset of the plurality of channel regions and keeping a second portion of the silicon-containing passivation layer disposed around the second subset of the plurality of channel regions; and after removing the first portion of the silicon-containing passivation layer, forming a gate fill material around the plurality of channel regions.

20 Claims, 18 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 88/00* | (2026.01) |

(52) U.S. Cl.
CPC ..... *H10D 30/6735* (2025.01); *H10D 30/6739* (2025.01); *H10D 62/121* (2025.01); *H10D 64/017* (2025.01); *H10D 64/018* (2025.01); *H10D 84/0167* (2025.01); *H10D 84/017* (2025.01); *H10D 84/0177* (2025.01); *H10D 84/0188* (2025.01); *H10D 84/038* (2025.01); *H10D 88/01* (2025.01)

(58) Field of Classification Search
CPC .. H10D 62/121; H10D 64/017; H10D 64/018; H10D 84/0167; H10D 84/017; H10D 84/0177; H10D 84/0188; H10D 84/038; H10D 88/01
See application file for complete search history.

(56) References Cited

U.S. PATENT DOCUMENTS

| | | | |
|---|---|---|---|
| 11,798,851 B2 * | 10/2023 | Xie ................... H10D 84/0193 |
| 2020/0294866 A1 | 9/2020 | Cheng et al. | |
| 2021/0273050 A1 | 9/2021 | Peng et al. | |
| 2022/0037528 A1 | 2/2022 | Chuang et al. | |
| 2022/0320084 A1 | 10/2022 | Huang | |
| 2022/0416057 A1 | 12/2022 | Bouche et al. | |
| 2023/0178552 A1 * | 6/2023 | Huang ................ H10D 64/017 |
| | | | 257/351 |

FOREIGN PATENT DOCUMENTS

| | | | |
|---|---|---|---|
| TW | 202301479 A | 1/2023 |
| TW | 202303902 A | 1/2023 |

* cited by examiner

300A 169
168
166
132 66U
66U
66U
66M
182U
182
66M
66L
66L

126

162

100

70
62
70
62
70

66U
66U
66M
66M
66L
66L

50

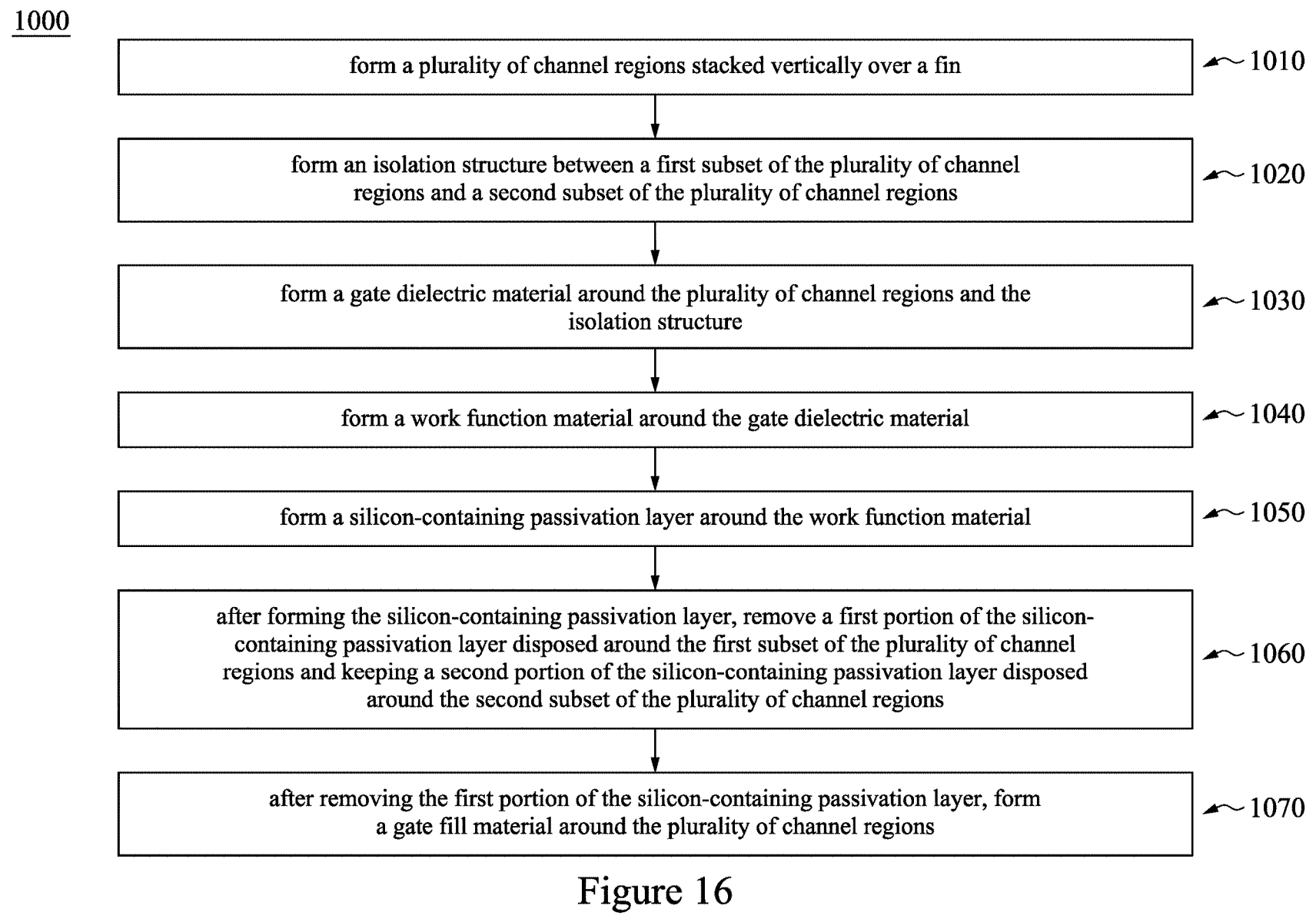

1000

~ 1010 form a plurality of channel regions stacked vertically over a fin

~ 1020 form an isolation structure between a first subset of the plurality of channel regions and a second subset of the plurality of channel regions

~ 1030 form a gate dielectric material around the plurality of channel regions and the isolation structure

~ 1040 form a work function material around the gate dielectric material

~ 1050 form a silicon-containing passivation layer around the work function material

~ 1060 after forming the silicon-containing passivation layer, remove a first portion of the silicon-containing passivation layer disposed around the first subset of the plurality of channel regions and keeping a second portion of the silicon-containing passivation layer disposed around the second subset of the plurality of channel regions

~ 1070 after removing the first portion of the silicon-containing passivation layer, form a gate fill material around the plurality of channel regions

Figure 16

COMPLEMENTARY FIELD-EFFECT TRANSISTOR DEVICES AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 is a flow chart of a method of forming a CFET device, in accordance with some embodiments.

DETAILED DESCRIPTION

Figure 1:
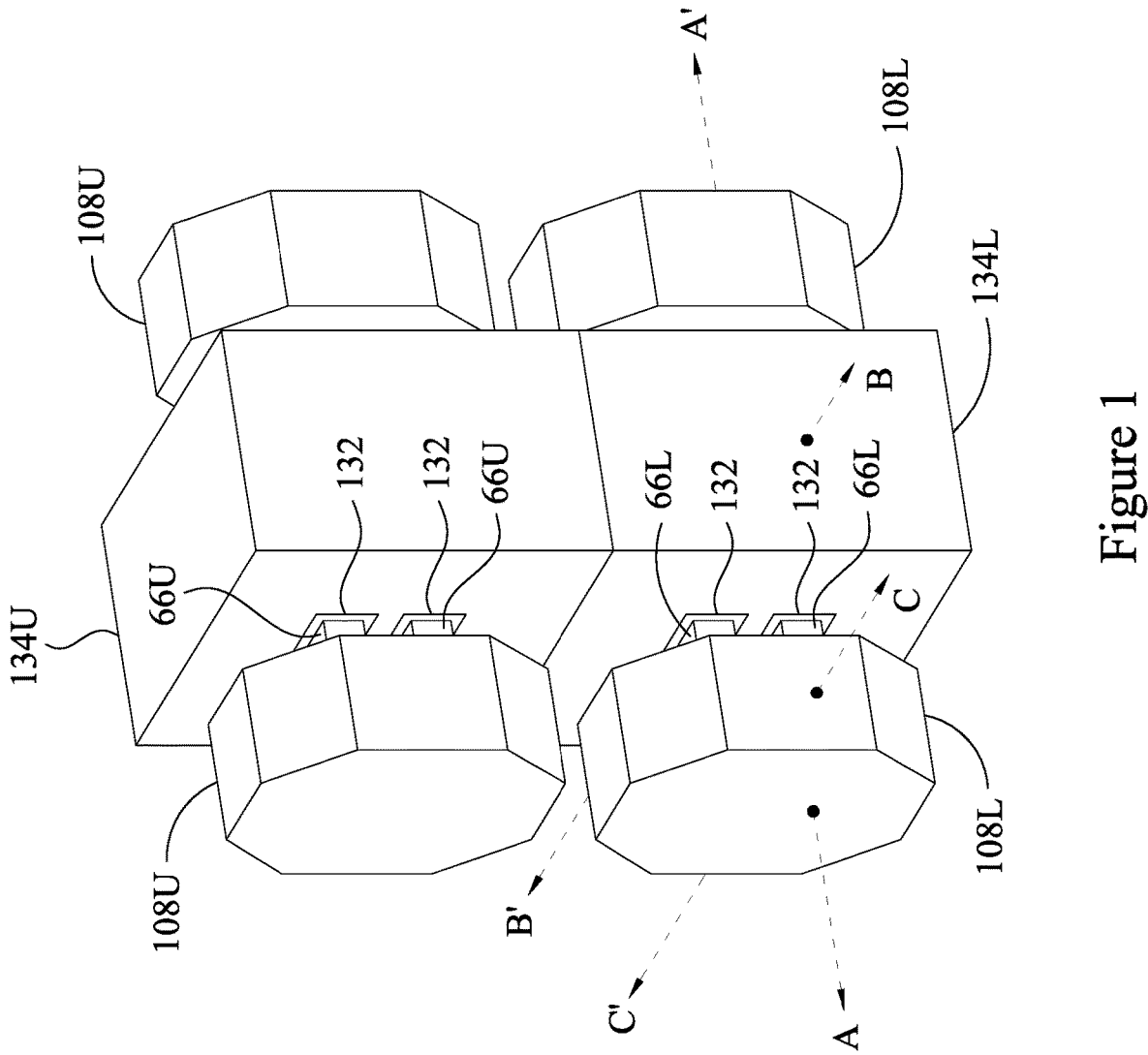
FIG. 1 illustrates an example of a complementary field-effect transistor (CFET) schematic in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Throughout the discussion, unless otherwise specified, the same or similar reference numerals in different figures refer to the same or similar element formed by a same or similar material(s) using the same or similar formation method(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, CFETs are formed. A CFET includes a lower nanostructure-FET and an upper nanostructure-FET. An isolation structure (also referred to as a nanostructure isolation material) is formed between the nanostructures of the lower nanostructure-FET and the nanostructures of the upper nanostructure-FET. A gate dielectric material and a p-type work function material are formed around the channel regions of the lower nanostructure-FET and the upper nanostructure-FET. Subsequently, a silicon-containing passivation layer is formed over the p-type work function material using a treatment process performed using a silicon-containing gas. A first portion of the silicon-containing passivation layer around the channel regions of a first one of the nanostructure-FETs (e.g., the lower nanostructure-FET, or the upper nanostructure-FET) is removed, while a second portion of the silicon-containing passivation layer around the channel regions of a second one of the nanostructure-FETs remain and is used as a second work function material (in addition to the work function layer) to tune the threshold voltage of the second one of the nanostructure-FETs (e.g., an n-type nanostructure-FET). The first one of the nanostructure-FETs is formed as a p-type nanostructure-FET, and the second one of the nanostructure-FETs is formed as a n-type nanostructure-FET. Next, a gate fill material (e.g., a metal material) is formed around the channel regions of the lower nanostructure-FET and the upper nanostructure-FET to form a common metal gate in one step. Unlike a dual metal gate process, where the upper metal gate is removed by an etched-back process and then replaced by a final upper metal gate, the current disclosed method forms the common metal gate in one step, and no upper gate etch-back is needed, which simplifies processing and avoid device damage and performance degradation caused by the upper gate etch-back process. The disclosed method also obviates the need to form a thick n-type work function material for the n-type nanostructure-FET, thus increasing device integration density.

FIG. 1 illustrates an example of a CFET schematic, in accordance with some embodiments. FIG. 1 is a three-dimensional view, where some features of the CFETs are omitted for illustration clarity.

The CFETs include multiple vertically stacked nanostructure-FETs (e.g., nanowire FETs, nanosheet FETs, multi bridge channel (MBC) FETs, nanoribbon FETs, gate-all-around (GAA) FETs, or the like). For example, a CFET may include a lower nanostructure-FET of a first device type (e.g., n-type/p-type) and an upper nanostructure-FET of a second device type (e.g., p-type/n-type) that is opposite the first device type. Specifically, the CFET may include a lower PMOS transistor and an upper NMOS transistor, or the CFET may include a lower NMOS transistor and an upper PMOS transistor. Each of the nanostructure-FETs include semiconductor nanostructures 66 (including lower semiconductor nanostructures 66L and upper semiconductor nanostructures 66U), where the semiconductor nanostructures 66 act as channel regions (also referred to as channel layers, semiconductor channels regions, or semiconductor channel layers) for the nanostructure-FETs. The semiconductor nanostructures 66 may be nanosheets, nanowires, or the like. The lower semiconductor nanostructures 66L are for a lower nanostructure-FET and the upper semiconductor nanostructures 66U are for an upper nanostructure-FET. A nanostructure isolation material (not explicitly illustrated in FIG. 1, see 100 in FIGS. 12A and 12B) may be used to separate and electrically isolate the upper semiconductor nanostructures 66U from the lower semiconductor nanostructures 66L.

Gate dielectrics 132 are along top surfaces, sidewalls, and bottom surfaces of the semiconductor nanostructures 66. Gate electrodes 134 (including a lower gate electrode 134L and an upper gate electrode 134U) are over the gate dielectrics 132 and around the semiconductor nanostructures 66. Source/drain regions 108 (including lower epitaxial source/drain regions 108L and upper epitaxial source/drain regions 108U) are disposed at opposing sides of the gate dielectrics 132 and the gate electrodes 134. Source/drain region(s) 108 may refer to a source or a drain, individually or collectively dependent upon the context. Isolation features may be formed to separate desired ones of the source/drain regions 108 and/or desired ones of the gate electrodes 134. For example, a lower gate electrode 134L may optionally be separated from an upper gate electrode 134U by an isolation layer. Alternatively, a lower gate electrode 134L may be coupled to an upper gate electrode 134U. Further, the upper epitaxial source/drain regions 108U may be separated from lower epitaxial source/drain regions 108L by one or more dielectric layers. The isolation features between channel regions, gates, and source/drain regions allow for vertically stacked transistors, thereby improving device density. Because of the vertically stacked nature of CFETs, the schematic may also be referred to as stacking transistors or folding transistors.

FIG. 1 further illustrates reference cross-sections that are used in later figures. Cross-section A-A' is parallel to a longitudinal axis of the semiconductor nanostructures 66 of a CFET and in a direction of, for example, a current flow between the source/drain regions 108 of the CFET. Cross-section B-B' is perpendicular to cross-section A-A' and along a longitudinal axis of a gate electrode 134 of a CFET. Cross-section C-C' is parallel to cross-section B-B' and extends through the source/drain regions 108 of the CFETs. Subsequent figures refer to these reference cross-sections for clarity.

Figure 2:
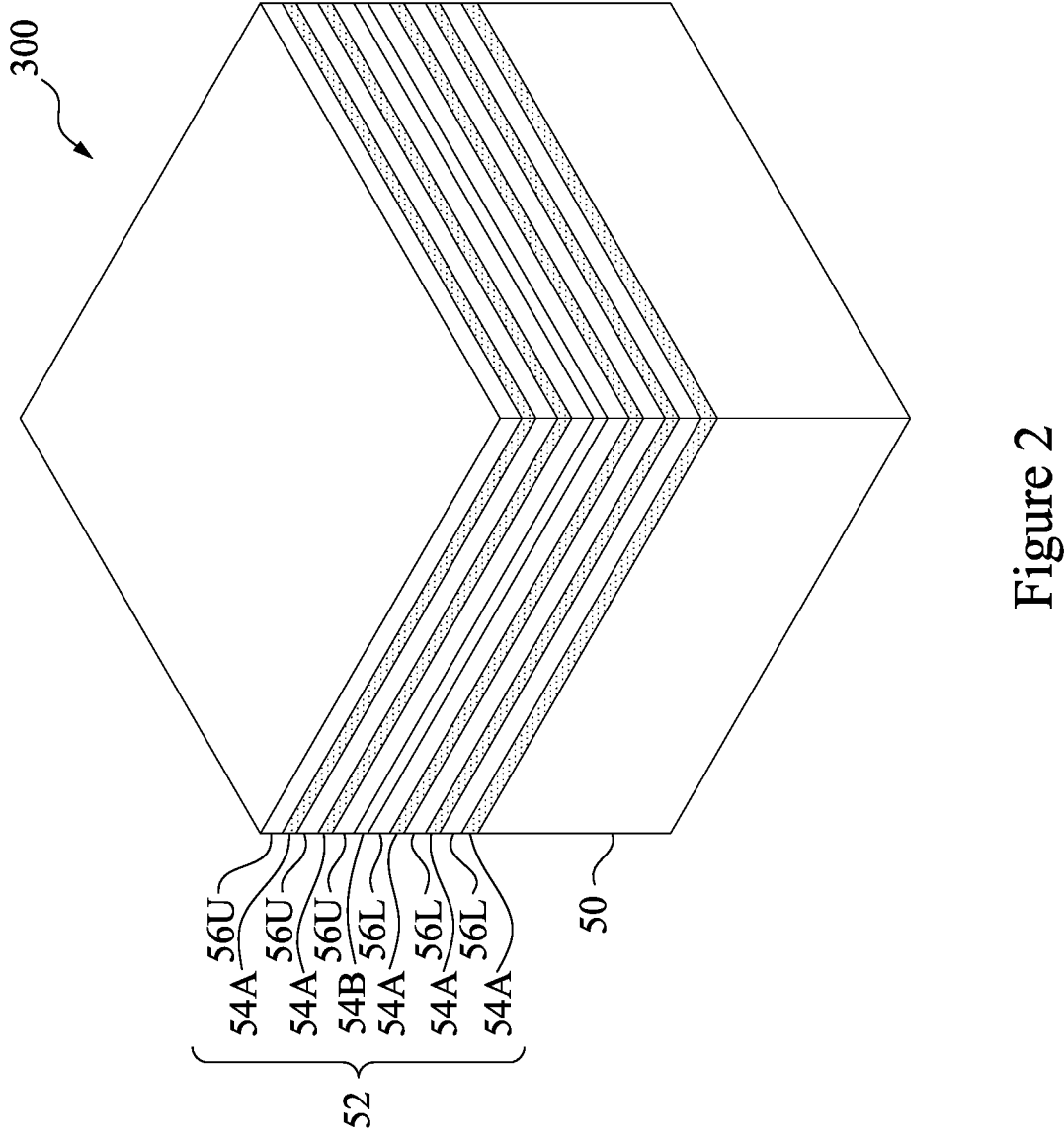
FIGS. 2-11, 12A, and 12B are cross-sectional views of a CFET device at various stages of manufacturing, in accordance with an embodiment.
Figure 3:
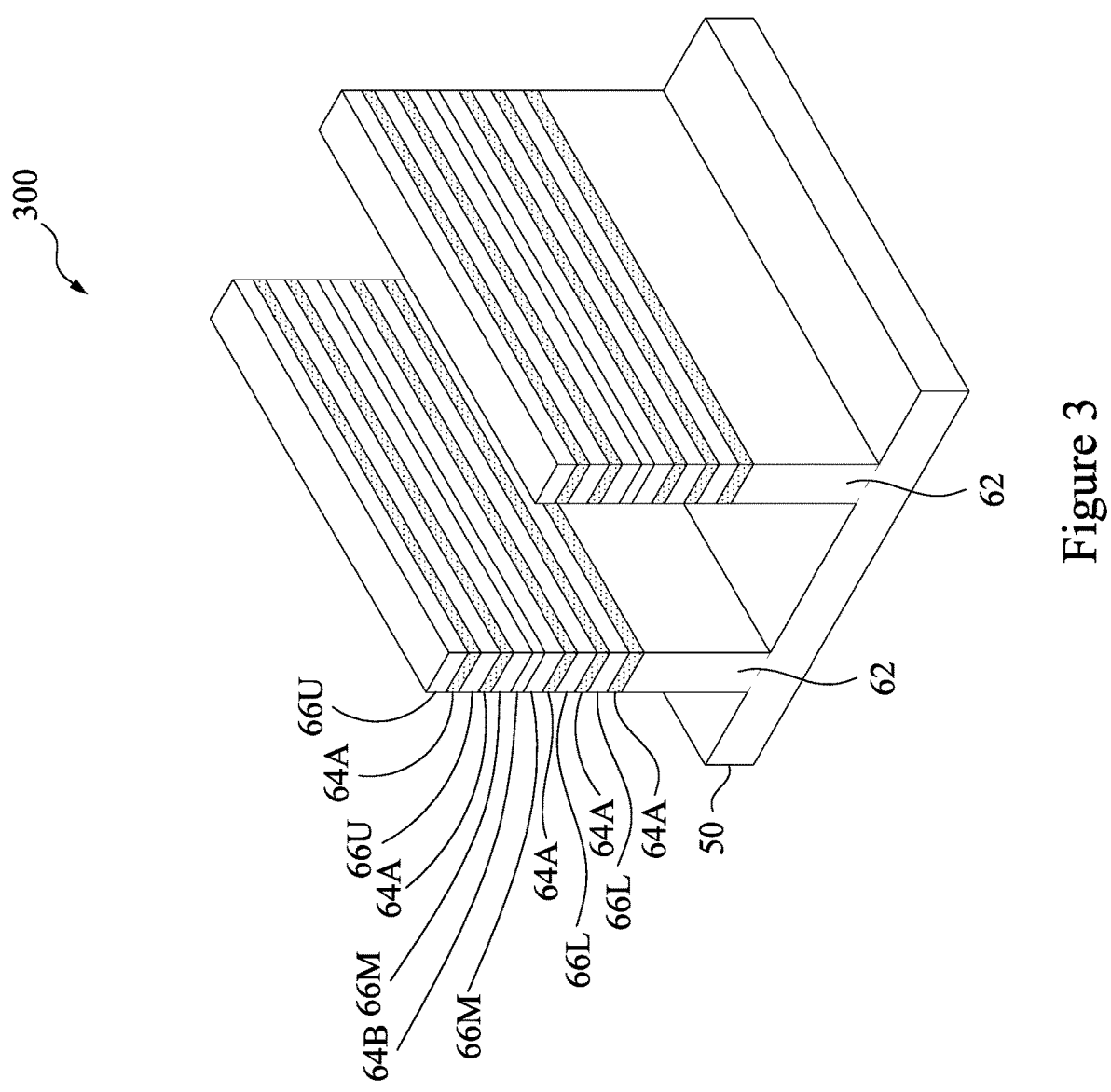
Figure 4:
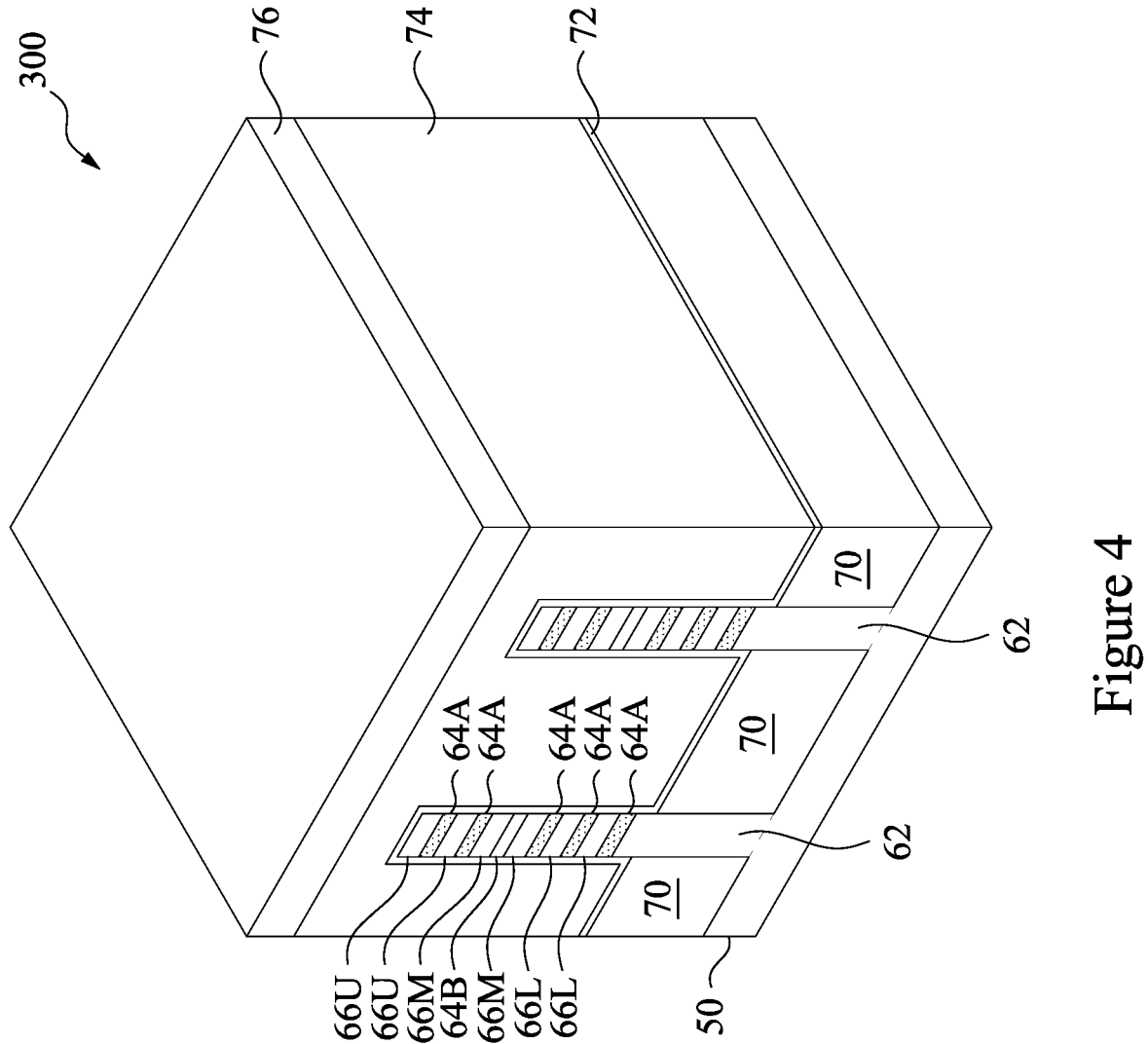

FIGS. 2-11, 12A, and 12B are cross-sectional views of a CFET device 300 at various stages of manufacturing, in accordance with an embodiment. FIGS. 2, 3, and 4 are three-dimensional views showing a similar three-dimensional view as FIG. 1. FIGS. 5, 6, 7A, and 12A illustrate cross-sectional views along a similar cross-section as reference cross-section A-A' in FIG. 1. FIGS. 7B, 8-11 and 12B illustrate cross-sectional views along a similar cross-section as reference cross-section B-B' in FIG. 1.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including carbon-doped silicon, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

A multi-layer stack 52 is formed over the substrate 50. The multi-layer stack 52 includes alternating dummy layers 54 (including first dummy layers 54A and a second dummy layer 54B) and semiconductor layers 56 (including lower semiconductor layers 56L and upper semiconductor layers 56U). The lower semiconductor layers 56L and a subset of the first dummy layers 54A are disposed below the second dummy layer 54B. The upper semiconductor layers 56U and another subset of the first dummy layers 54A are disposed above the second dummy layer 54B. As subsequently described in greater detail, the dummy layers 54 will be removed and the semiconductor layers 56 will be patterned to form channel regions of CFETs. Specifically, the lower semiconductor layers 56L will be patterned to form channel regions of the lower nanostructure-FETs of the CFETs, and the upper semiconductor layers 56U will be patterned to form channel regions of the upper nanostructure-FETs of the CFETs.

The multi-layer stack 52 is illustrated as including six of the dummy layers 54 and six of the semiconductor layers 56. It should be appreciated that the multi-layer stack 52 may include any number of the dummy layers 54 and the semiconductor layers 56. Each layer of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like.

The first dummy layers 54A are formed of a first semiconductor material, and the second dummy layer 54B is formed of a second semiconductor material. The first and second semiconductor materials may be selected from the candidate semiconductor materials of the substrate 50. The semiconductor materials of the first dummy layers 54A and the second dummy layer 54B will be subsequently described in greater detail. The first and second semiconductor materials have a high etching selectivity to one another. As such, the material of the second dummy layer 54B may be removed at a faster rate than the material of the first dummy layers 54A in subsequent processing.

The semiconductor layers 56 (including the lower semiconductor layers 56L and upper semiconductor layers 56U) are formed of one or more semiconductor material(s). The semiconductor material(s) may be selected from the candidate semiconductor materials of the substrate 50. In some embodiments, the semiconductor layers 56 is formed of a group IV-V material or a group III-V material. The lower semiconductor layers 56L and the upper semiconductor layers 56U may be formed of the same semiconductor material, or may be formed of different semiconductor materials. In some embodiments, the lower semiconductor layers 56L and the upper semiconductor layers 56U are both be formed of a semiconductor material suitable for p-type devices and n-type devices, such as silicon. In some embodiments, the lower semiconductor layers 56L are formed of a semiconductor material suitable for p-type devices, such as germanium or silicon-germanium, and the upper semiconductor layers 56U are formed of a semiconductor material suitable for n-type devices, such as silicon or carbon-doped silicon. The semiconductor material(s) of the semiconductor layers 56 will be subsequently described in greater detail. The semiconductor material(s) of the semiconductor layers 56 have a high etching selectivity to the semiconductor materials of the dummy layers 54. As such, the materials of the dummy layers 54 may be removed at a faster rate than the material of the semiconductor layers 56 in subsequent processing.

Some layers of the multi-layer stack 52 may be thicker than other layers of the multi-layer stack 52. The thickness of the second dummy layer 54B may be different (e.g., greater or less) than the thickness of each of the first dummy layers 54A. In some embodiments, the second dummy layer 54B has a large thickness, such as a greater thickness than each of the first dummy layers 54A. Forming the second dummy layer 54B to a large thickness allows the second dummy layer 54B to be more easily removed in subsequently processing. Additionally, the thickness of each of the semiconductor layers 56 may be different (e.g., greater or less) than the thickness(es) of each of the first dummy layers 54A and/or the second dummy layer 54B. In some embodiments, each of the semiconductor layers 56 may be thicker than each of the dummy layers 54.

In some embodiments, the first dummy layers 54A are formed of silicon-germanium with a first germanium atomic percentage, the second dummy layer 54B is formed of silicon-germanium with a second germanium atomic percentage that is higher than the first germanium atomic percentage. The difference between the second germanium atomic percentage and the first germanium atomic percentage may be higher than about 30 percent, and may be in the range between about 30 percent and about 70 percent. The higher germanium atomic percentage allows the second dummy layer 54B to be etched at a faster rate than the first dummy layers 54A, and allow the second dummy layer 54B to be completed removed during a subsequent etching process, as discussed hereinafter.

In FIG. 3, fins 62 are formed in the substrate 50 and nanostructures 64, 66 (including first dummy nanostructures 64A, second dummy nanostructures 64B, lower semiconductor nanostructures 66L, middle semiconductor nanostructures 66M, and upper semiconductor nanostructures 66U) are formed in the multi-layer stack 52. In some embodiments, the nanostructures 64, 66 and the fins 62 may be formed in the multi-layer stack 52 and the substrate 50, respectively, by etching trenches in the multi-layer stack 52 and the substrate 50. The etching may be any acceptable etch process, such as a reactive ion etch (RIE), neutral beam etch (NBE), the like, or a combination thereof. The etching may be anisotropic. Forming the nanostructures 64, 66 by etching the multi-layer stack 52 may define the first dummy nanostructures 64A from the first dummy layers 54A, the second dummy nanostructures 64B from the second dummy layer 54B, the lower semiconductor nanostructures 66L from some of the lower semiconductor layers 56L, the upper semiconductor nanostructures 66U from some of the upper semiconductor layers 56U, and the middle semiconductor nanostructures 66M from some of the lower semiconductor layers 56L and some of the upper semiconductor layers 56U. The first dummy nanostructures 64A and the second dummy nanostructures 64B may further be collectively referred to as the dummy nanostructures 64. The lower semiconductor nanostructures 66L and the upper semiconductor nanostructures 66U may further be collectively referred to as the semiconductor nanostructures 66.

As subsequently described in greater detail, the dummy nanostructures 64 will be removed to form channel regions of CFETs. Specifically, the lower semiconductor nanostructures 66L will act as channel regions for lower nanostructure-FETs of the CFETs. Additionally, the upper semiconductor nanostructures 66U will act as channel regions for upper nanostructure-FETs of the CFETs.

The middle semiconductor nanostructures 66M are the semiconductor nanostructures 66 that are directly above/below (e.g., in contact with) the second dummy nanostructures 64B. Depending on the heights of subsequently formed source/drain regions, the middle semiconductor nanostructures 66M may or may not adjoin any source/drain regions and may or may not act as functional channel regions for the CFETs. The second dummy nanostructures 64B will be subsequently replaced with isolation structures. The isolation structures and the middle semiconductor nanostructures 66M may define boundaries of the lower nanostructure-FETs and the upper nanostructure-FETs.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 62 and the nanostructures 64, 66. In some embodiments, a mask (or other layer) may remain on the nanostructures 64, 66.

Although each of the fins 62 and the nanostructures 64, 66 are illustrated as having a constant width throughout, in other embodiments, the fins 62 and/or the nanostructures 64, 66 may have tapered sidewalls such that a width of each of the fins 62 and/or the nanostructures 64, 66 continuously increases in a direction towards the substrate 50. In such embodiments, each of the nanostructures 64, 66 may have a different width and be trapezoidal in cross-section view.

In FIG. 4, isolation regions 70 are formed adjacent to the fins 62. The isolation regions 70 may be formed by depositing an insulating material over the substrate 50, the fins 62, and nanostructures 64, 66, and between adjacent fins 62. The insulating material may be an oxide, such as silicon oxide, a nitride, the like, or a combination thereof, and may be formed by high-density plasma chemical vapor deposition (HDP-CVD), flowable chemical vapor deposition (FCVD), the like, or a combination thereof. Other insulating materials formed by any acceptable process may be used. In some embodiments, the insulating material is silicon oxide formed by an FCVD process. An anneal process may be performed once the insulating material is formed. In an embodiment, the insulating material is formed such that excess insulating material covers the nanostructures 64, 66. Although the insulating material is illustrated as a single layer, some embodiments may utilize multiple layers. For example, in some embodiments a liner (not separately illustrated) may first be formed along a surface of the substrate 50, the fins 62, and the nanostructures 64, 66. Thereafter, a fill material, such as one of the previously described insulating materials may be formed over the liner.

A removal process is then applied to the insulating material to remove excess insulating material over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the insulating material are level after the planarization process is complete.

The insulating material is then recessed to form the isolation regions 70. The insulating material is recessed such that upper portions of the fins 62 protrude from between neighboring isolation regions 70. Further, the top surfaces of the isolation regions 70 may have a flat surface as illustrated, a convex surface, a concave surface (such as dishing), or a combination thereof. The top surfaces of the isolation regions 70 may be formed flat, convex, and/or concave by an appropriate etch. The isolation regions 70 may be recessed using an etching process, such as one that is selective to the insulating material (e.g., selectively etches the insulating material at a faster rate than the materials of the fins 62 and the nanostructures 64, 66). For example, an oxide removal using, for example, dilute hydrofluoric (dHF) acid may be used.

In FIG. 4, a dummy dielectric layer 72 is formed on the fins 62 and/or the nanostructures 64, 66. The dummy dielectric layer 72 may be, for example, silicon oxide, silicon nitride, a combination thereof, or the like, and may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be a conductive or non-conductive material and may be selected from a group including amorphous silicon, polycrystalline-silicon (polysilicon), poly-crystalline silicon-germanium (poly-SiGe), or the like. The dummy gate layer 74 may be deposited by physical vapor deposition (PVD), CVD, sputter deposition, or other techniques for depositing the selected material. The dummy gate layer 74 may be formed of other materials that have a high etching selectivity to insulating materials. The mask layer 76 may include, for example, silicon nitride, silicon oxynitride, or the like. In the illustrated embodiment, the dummy dielectric layer 72 covers the isolation regions 70, such that the dummy dielectric layer 72 extends between the dummy gate layer 74 and the isolation regions 70. In another embodiment, the dummy dielectric layer 72 covers only the fins 62 and/or the nanostructures 64, 66.

Figure 5:
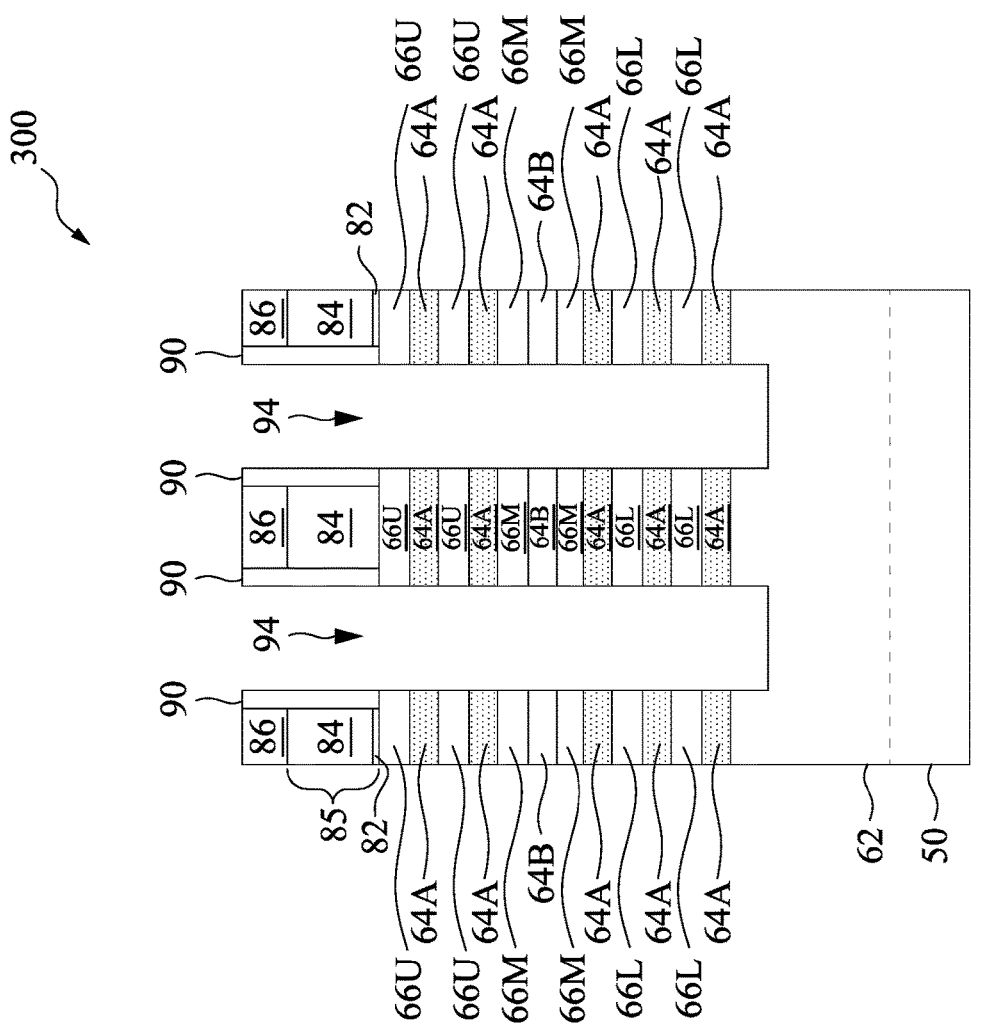

Next, in FIG. 5, the mask layer 76 is patterned using acceptable photolithography and etching techniques to form masks 86. The pattern of the masks 86 is then transferred to the dummy gate layer 74 and to the dummy dielectric layer 72 to form dummy gates 84 and dummy dielectrics 82, respectively. The dummy gates 84 and the dummy dielectrics 82 are collectively referred to as dummy gate stacks 85. The dummy gates 84 cover respective channel regions of the nanostructures 64, 66. The pattern of the masks 86 may be used to physically separate each of the dummy gates 84 from adjacent dummy gates 84. The dummy gates 84 may also have a lengthwise direction substantially perpendicular to the lengthwise direction of respective fins 62. The masks 86 can optionally be removed after patterning, such as by any acceptable etching technique.

In FIG. 5, gate spacers 90 are formed over the nanostructures 64, 66 and on exposed sidewalls of the masks 86 (if present), the dummy gates 84, and the dummy dielectrics 82. The gate spacers 90 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other dielectric materials formed by any acceptable process may be used. Any acceptable etch process, such as a dry etch, may be performed to pattern the dielectric material(s). The etching may be anisotropic. The dielectric material(s), when etched, have portions left on the sidewalls of the dummy gates 84 (thus forming the gate spacers 90). Fin spacers may also be formed as part of forming the gate spacers 90.

Source/drain recesses 94 are formed in the nanostructures 64, 66, and the fins 62. Epitaxial source/drain regions will be subsequently formed in the source/drain recesses 94. The source/drain recesses 94 may extend through the nanostructures 64, 66 and into the fins 62. The fins 62 may be etched such that bottom surfaces of the source/drain recesses 94 are disposed above, below, or level with the top surfaces of the isolation regions 70. The source/drain recesses 94 may be formed by etching the nanostructures 64, 66, and the substrate 50 using anisotropic etching processes, such as RIE, NBE, or the like. The gate spacers 90 and the dummy gates 84 mask portions of the nanostructures 64, 66, and the fins 62 during the etching processes used to form the source/drain recesses 94. A single etch process or multiple etch processes may be used to etch each layer of the nanostructures 64, 66, and the fins 62. Timed etch processes may be used to stop the etching of the source/drain recesses 94 after the source/drain recesses 94 reach a desired depth.

Figure 6:
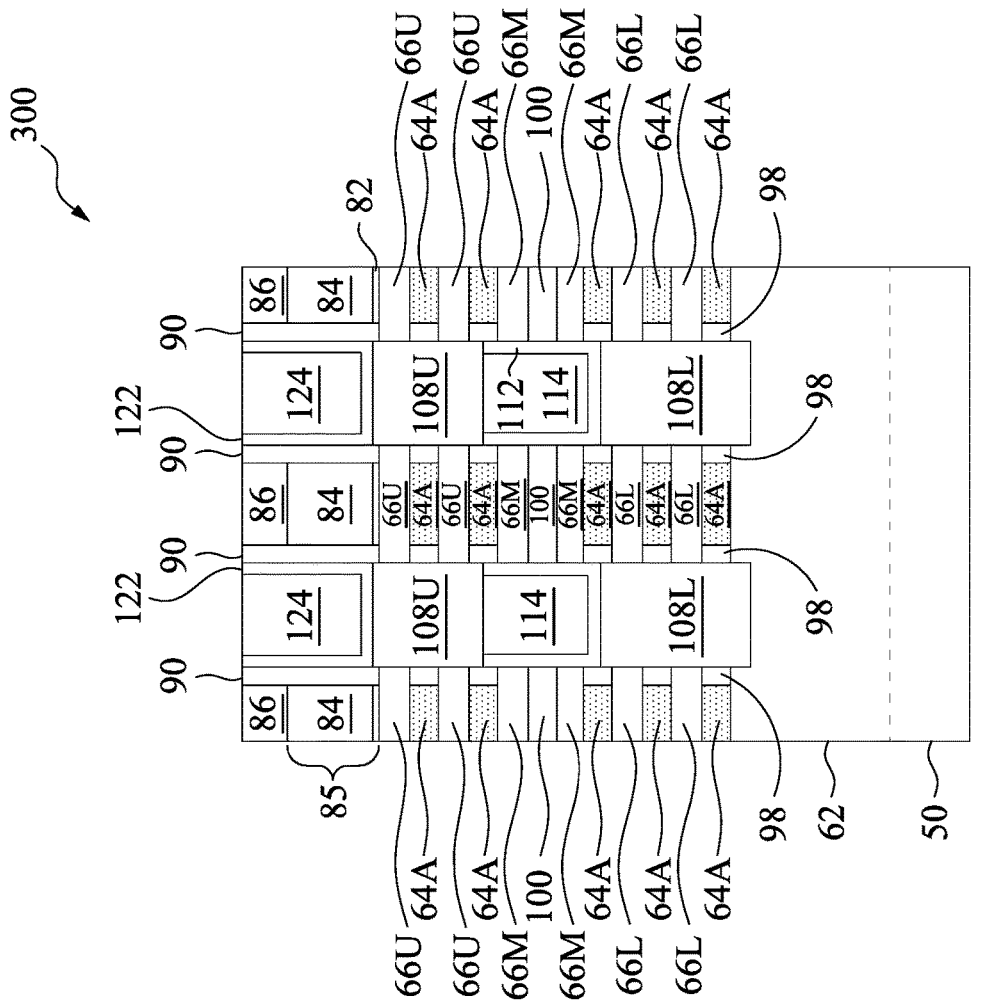

Next, in FIG. 6, inner spacers 98 and dielectric isolation layers 100 are formed. Forming inner spacers 98 and dielectric isolation layers 100 (also referred to as isolation structures 100) may include an etching process that laterally etches the dummy nanostructures 64A and removes the dummy nanostructure 64B. The etching process may be isotropic and may be selective to the material of the dummy nanostructures 64, so that the dummy nanostructures 64 are etched at a faster rate than the semiconductor nanostructures 66. The etching process may also be selective to the material of the dummy nanostructures 64B, so that the dummy nanostructures 64B are etched at a faster rate than the dummy nanostructures 64A. In this manner, the dummy nanostructures 64B may be completely removed from between the middle semiconductor nanostructures 66M without completely removing the dummy nanostructures 64A. In some embodiments where the dummy nanostructures 64B are formed of germanium or silicon germanium with a high germanium atomic percentage, the dummy nanostructures 64A are formed of silicon germanium with a low germanium atomic percentage, and the semiconductor nanostructures 66 are formed of silicon free from germanium, the etch process may comprise a dry etch process using chlorine gas, with or without a plasma. Because the dummy gate stacks 85 wrap around sidewalls of the semiconductor nanostructures 66 (see FIG. 4), the dummy gate stacks 85 may support the upper semiconductor nanostructures 66U so that the upper semiconductor nanostructures 66U do not collapse upon removal of the dummy nanostructures 64B. Further, although sidewalls of the dummy nanostructures 64A are illustrated as being straight after the etching, the sidewalls may be concave or convex.

Inner spacers 98 are formed on sidewalls of the recessed dummy nanostructures 64A, and dielectric isolation layers 100 are formed between the middle semiconductor nanostructures 66M. As subsequently described in greater detail, source/drain regions will be subsequently formed in the source/drain recesses 94, and the dummy nanostructures 64A will be replaced with corresponding gate structures. The inner spacers 98 act as isolation features between the subsequently formed source/drain regions and the subsequently formed gate structures. Further, the inner spacers 98 may be used to prevent damage to the subsequently formed source/drain regions by subsequent etch processes, such as the etch processes used to form gate structures. Dielectric isolation layers 100, on the other hand, are used to isolate the upper semiconductor nanostructures 66U (collectively) from the lower semiconductor nanostructures 66L (collectively). Further, the middle semiconductor nanostructures 66M and the dielectric isolation layers 100 may define the boundaries of the lower nanostructure-FETs and the upper nanostructure-FETs.

The inner spacers 98 and the dielectric isolation layers 100 may be formed by conformally depositing an insulating material in the source/drain recesses 94, on sidewalls of the dummy nanostructures 64A, and between the middle semiconductor nanostructures 66M, and then etching the insulating material. The insulating material may be a non-low-k dielectric material, which may be a carbon-containing dielectric material such as silicon oxycarbonitride, silicon oxycarbide, or the like. The insulating material may be formed by a deposition process, such as ALD, CVD, or the like. The etching of the insulating material may be anisotropic or isotropic. The insulating material, when etched, has portions remaining in the sidewalls of the dummy nanostructures 64A (thus forming the inner spacers 98) and has portions remaining in between the middle semiconductor nanostructures 66M (thus forming the dielectric isolation layers 100).

As also illustrated by FIG. 6, lower epitaxial source/drain regions 108L and upper epitaxial source/drain regions 108U are formed. The lower epitaxial source/drain regions 108L are formed in the lower portions of the source/drain recesses 94. The lower epitaxial source/drain regions 108L are in contact with the lower semiconductor nanostructures 66L and are not in contact with the upper semiconductor nanostructures 66U. Inner spacers 98 electrically insulate the lower epitaxial source/drain regions 108L from the dummy nanostructures 64A, which will be replaced with replacement gates in subsequent processes.

The lower epitaxial source/drain regions 108L are epitaxially grown, and have a conductivity type that is suitable for the device type (p-type or n-type) of the lower nanostructure-FETs. When lower epitaxial source/drain regions 108L are n-type source/drain regions, the respective material may include silicon or carbon-doped silicon, which is doped with an n-type dopant such as phosphorous, arsenic, or the like. When lower epitaxial source/drain regions 108L are p-type source/drain regions, the respective material may include silicon or silicon germanium, which is doped with a p-type dopant such as boron, indium, or the like. The lower epitaxial source/drain regions 108L may be in-situ doped, and may be, or may not be, implanted with the corresponding p-type or n-type dopants. During the epitaxy of the lower epitaxial source/drain regions 108L, the upper semiconductor nanostructures 66U may be masked to prevent undesired epitaxial growth on the upper semiconductor nanostructures 66U. After the lower epitaxial source/drain regions 108L are grown, the masks on the upper semiconductor nanostructures 66U may then be removed.

As a result of the epitaxy processes used for forming the lower epitaxial source/drain regions 108L, upper surfaces of the lower epitaxial source/drain regions 108L have facets which expand laterally outward beyond sidewalls of the nanostructures 64 and 66. In some embodiments, adjacent lower epitaxial source/drain regions 108L remain separated after the epitaxy process is completed. In other embodiments, these facets cause neighboring lower epitaxial source/drain regions 108L of a same FET to merge.

A first contact etch stop layer (CESL) 112 and a first interlayer dielectric (ILD) 114 are formed over the lower epitaxial source/drain regions 108L. The first CESL 112 may be formed of a dielectric material having a high etching selectivity from the etching of the first ILD 114, such as silicon nitride, silicon oxide, silicon oxynitride, or the like, which may be formed by any suitable deposition process, such as CVD, ALD, or the like. The first ILD 114 may be formed of a dielectric material, which may be deposited by any suitable method, such as CVD, plasma-enhanced CVD (PECVD), or FCVD. The applicable dielectric material of the first ILD 114 may include phospho-silicate glass (PSG), boro-silicate glass (BSG), boron-doped phospho-silicate glass (BPSG), undoped silicate glass (USG), silicon oxide, or the like.

The formation processes may include depositing a conformal CESL layer, depositing a material for the first ILD 114, followed by a planarization process and then an etch-back process. In some embodiments, the first ILD 114 is etched first, leaving the first CESL 112 unetched. An anisotropic etching process is then performed to remove the portions of the first CESL 112 higher than the recessed first ILD 114. After the recessing, the sidewalls of the upper semiconductor nanostructures 66U are exposed.

Upper epitaxial source/drain regions 108U are then formed in the upper portions of the source/drain recesses 94. The upper epitaxial source/drain regions 108U may be epitaxially grown from exposed surfaces of the upper semiconductor nanostructures 66U. The materials of upper epitaxial source/drain regions 108U may be selected from the same candidate group of materials for forming lower source/drain regions 108L, depending on the desired conductivity type of upper epitaxial source/drain regions 108U. The conductivity type of the upper epitaxial source/drain regions 108U may be opposite the conductivity type of the lower epitaxial source/drain regions 108L. For example, the upper epitaxial source/drain regions 108U may be oppositely doped from the lower epitaxial source/drain regions 108L. The upper epitaxial source/drain regions 108U may be in-situ doped, and/or may be implanted, with an n-type or p-type dopant. Adjacent upper source/drain regions 108U may remain separated after the epitaxy process or may be merged.

After the epitaxial source/drain regions 108U are formed, a second CESL 122 and a second ILD 124 are formed. The materials and the formation methods may be similar to the materials and the formation methods of first CESL 112 and first ILD 114, respectively, and are not discussed in detail herein. The formation process may include depositing the layers for the second CESL 122 and the second ILD 124, and performing a planarization process to remove the excess portion of the corresponding layers. After the planarization process, top surfaces of the second ILD 124, the second CESL 122, the gate spacers 90, and the masks 86 are coplanar (within process variations). The planarization process may leave masks 86 unremoved (as shown), or may remove the masks 86, in which case the top surface of the second ILD 124 is level with the top surface of the dummy gate stacks 85.

Figure 7A:
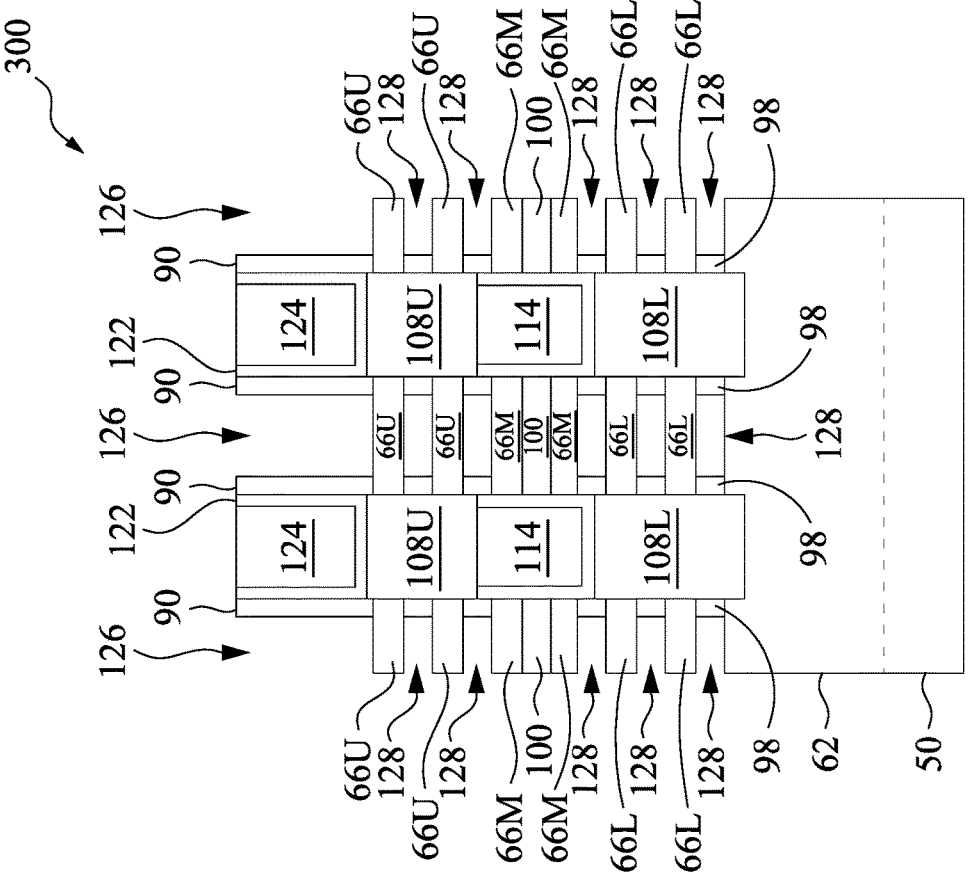
Figure 7B:
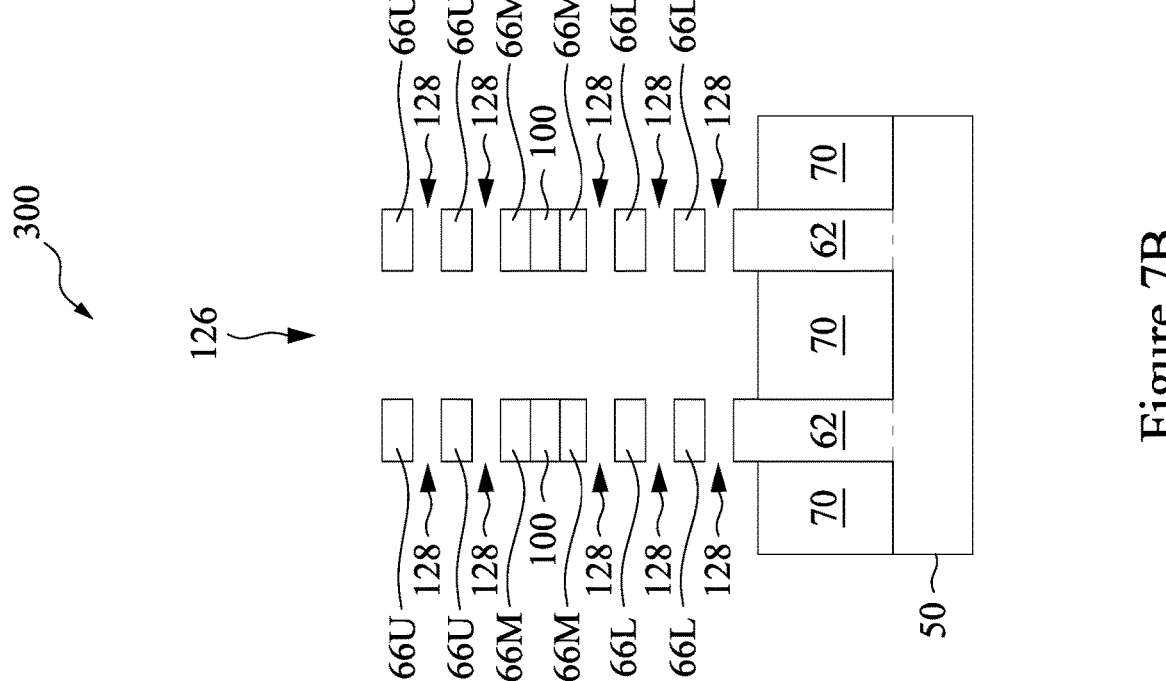

Next, in FIGS. 7A-7B, the mask 86 (if not removed already) is removed, e.g., by a CMP process. Next, the dummy gate stacks 85 are removed in one or more etching steps, so that recesses 126 are formed between the gate spacers 90. In some embodiments, the dummy gates 84 and the dummy dielectrics 82 are removed by an anisotropic dry etch process. For example, the etching process may include a dry etch process using reaction gas(es) that selectively etch the material of the dummy gates 84. Each of the recesses 126 exposes and/or overlies portions of nanostructures 64, 66 which act as the channel regions in the resulting devices. The portions of the nanostructures 64, 66 which act as the channel regions are disposed between neighboring pairs of the lower epitaxial source/drain regions 108L or between neighboring pairs of the upper epitaxial source/drain regions 108U. During the removal, the dummy dielectrics 82 may be used as etch stop layers when the dummy gates 84 are etched. The dummy dielectrics 82 may then be removed after the removal of the dummy gates 84.

The remaining portions of the first dummy nanostructures 64A are then removed to form openings 128 in regions between the semiconductor nanostructures 66. The remaining portions of the first dummy nanostructures 64A can be removed by any acceptable etch process that selectively etches the material of the first dummy nanostructures 64A at a faster rate than the materials of the semiconductor nanostructures 66, the inner spacers 98, and the isolation structures 100. The etching may be isotropic. For example, when the first dummy nanostructures 64A are formed of silicongermanium, the semiconductor nanostructures 66 are formed of silicon, the inner spacers 98 are formed of silicon oxycarbonitride, and the isolation structures 100 are formed of silicon oxycarbonitride, the etch process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the semiconductor nanostructures 66 and expand the openings 128. FIG. 7B shows the CFET device 300 of FIG. 7A, but along cross-section B-B' of FIG. 1.

Figure 8:
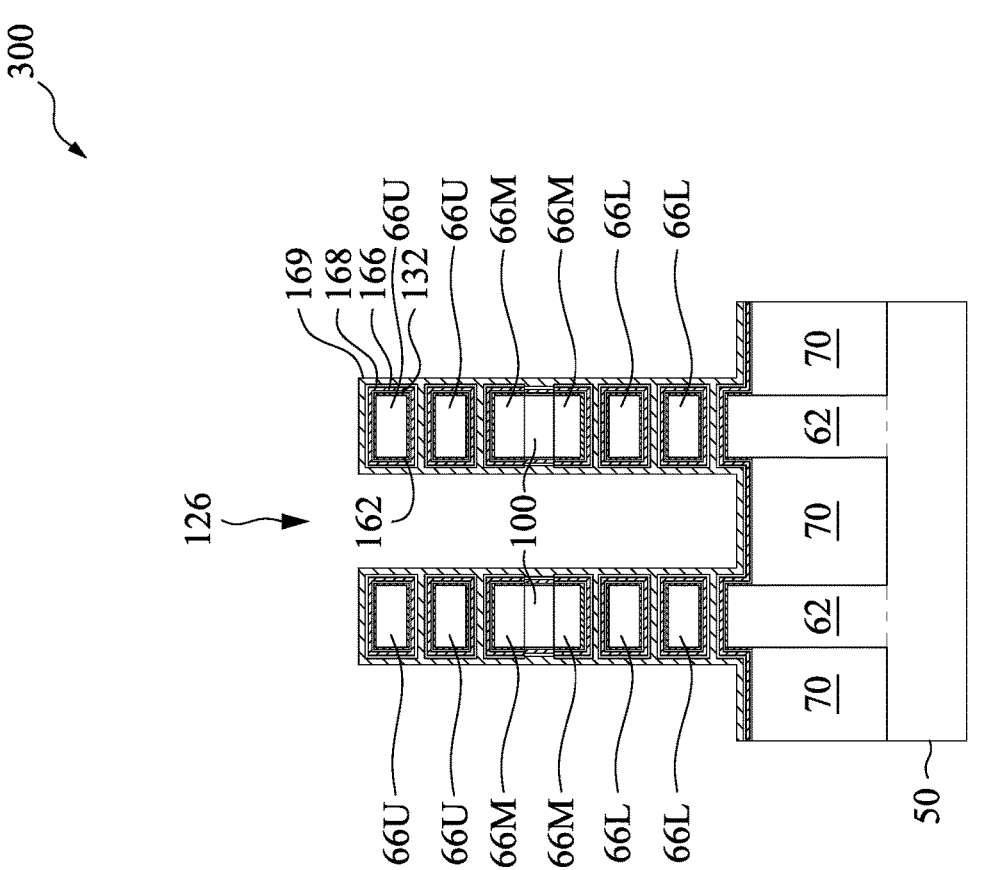

Next, in FIG. 8, an interfacial layer 162 is formed at the exterior surfaces of the nanostructures 66. In some embodiments, the interfacial layer 162 is formed of an oxide of a group II-VI material or an oxide of a group IV material. In the illustrated embodiment, the interfacial layer 162 is an oxide of the material of the nanostructures 66, and is formed by an oxidization process (e.g., a thermal oxidization process). In other words, the interfacial layer 162 is formed by converting (e.g., oxidizing) exterior portions of the nanostructures 66 into an oxide of the material of the nanostructures 66. As a result, the interfacial layer 162 is not formed on, e.g., the isolation structures 100 and the isolation regions 70, in the illustrated embodiment. In other embodiments, the interfacial layer 162 is formed by a deposition process (e.g., CVD), in which case the interfacial layer 162 is also formed on, e.g., the isolation structures 100 and the isolation regions 70. In some embodiments, the interfacial layer 162 is omitted. These and other variations are fully intended to be included within the scope of the present disclosure. A thickness of the interfacial layer 162 may be between about 0.5 nm and about 2 nm, as an example.

Next, a gate dielectric layer 132 is formed (e.g., conformally) over the interfacial layer 162 and along sidewalls of the isolation structures 100, such that the gate dielectric layer 132 conformally lines the recesses 126 and the openings 128. Specifically, the gate dielectric layer 132 is formed on the top surfaces of the fins 62; on the top surfaces, the sidewalls, and the bottom surfaces of the semiconductor nanostructures 66; along sidewalls of the isolation structures 100; and along the sidewalls of the gate spacers 90. The gate dielectric layer 132 wraps around all (e.g., four) sides of the semiconductor nanostructures 66. The gate dielectric layer

132 may also be formed on the top surfaces of the second ILD 124 and the gate spacers 90, and may be formed on the sidewalls of the fins 62 (e.g., in embodiments where the top surfaces of the isolation regions 70 are below the top surfaces of the fins 62).

The gate dielectric layer 132 may include an oxide such as silicon oxide or a metal oxide, a silicate such as a metal silicate, combinations thereof, multi-layers thereof, or the like. The gate dielectric layer 132 may include a high-dielectric constant (high-k) material having a k-value greater than about 7.0, such as a metal oxide or a silicate of hafnium, aluminum, zirconium, lanthanum, manganese, barium, titanium, lead, and combinations thereof. The formation methods of the gate dielectric layer 132 may include molecular-beam deposition (MBD), ALD, PECVD, and the like. A thickness of the gate dielectric layer 132 may be between about 1 nm and about 5 nm, as an example.

Next, a capping layer 166 (which is optional) and a work function layer 168 are formed conformally and successively on the gate dielectric layer 132. The capping layer 166 is used to protect the underlying gate dielectric layer 132, and therefore, may also be referred to as a high-k capping layer. The capping layer 166 may be formed of TIN, TiSiN, TaN, TaSiN, and the like, using a suitable formation method such as physical vapor deposition (PVD), CVD, ALD, PECVD, or the like. In some embodiments, the capping layer 166 is omitted.

A work function layer (also referred to as work function tuning layer) is formed of a work function material(s) (also referred to as work function tuning metal(s), or work function tuning material(s)) that is suitable for the device type (e.g., n-type or p-type) to be formed. Examples of p-type work function tuning metals include TiN, TaN, Ru, Mo, Al, WN, $ZrSi_2$, $MoSi_2$, $TaSi_2$, $NiSi_2$, WN, or combinations thereof. Examples of n-type work function tuning metals include Ti, Ag, TaAl, TaAlC, TiAlN, TaC, TaCN, TaSiN, Mn, Zr, or combinations thereof. A work function value is associated with the material composition of the work function layer, and thus, the material of the work function layer is chosen to tune its work function value so that a target threshold voltage $V_t$ is achieved in the device that is to be formed.

In some embodiments, the work function layer 168 is p-type work function layer, and is formed of TiN. A suitable formation method, such as CVD, PVD, ALD, or the like, may be performed to form the work function layer 168. A thickness of the work function layer 168 may be 2.5 nm or less, as an example.

Still referring to FIG. 8, a passivation layer 169 is formed on the work function layer 168 to conformally lines the recesses 126. In the illustrated embodiment, the passivation layer 169 is formed around the nanostructures 66, along sidewalls of the isolation structures 100, along top surfaces and sidewalls of the fins 62, and on the upper surface of the isolation regions 70. The passivation layer 169 may also be formed along sidewalls of the gate spacers 90, on the top surfaces of the second ILD 124 and the gate spacers 90.

In some embodiments, the passivation layer 169 (may also be referred to as a silicon-containing passivation layer) is formed by treating the work function layer 168 with a silicon-containing gas. The silicon-containing gas may be, e.g., $SiH_4$, $Si_2H_6$, or the like. In some embodiments, the treatment process is a thermal process, where the silicon-containing gas is supplied to be in contact, and react, with the work function layer 168 in gas format to form the passivation layer 169. In some embodiments, the treatment process is a plasma process, where the silicon-containing gas is ignited into a plasma of the silicon-containing gas, and the plasma of the silicon-containing gas reacts with the work function layer 168 to form the passivation layer 169.

In an example embodiment, the work function layer 168 is formed of TiN, and during the treatment process, atoms dissociated from the silicon-containing gas bond with TiN to form the silicon-containing passivation layer 169. In some embodiments, the silicon-containing passivation layer 169, when initially formed by the above treatment process, is a silicon layer, which silicon layer is then (partially) oxidized by oxygen in the ambient air to form silicon oxide. Therefore, the silicon-containing passivation layer 169 comprises silicon oxide. Note that due to the silicon oxide being formed by oxygen diffusing into the silicon-containing passivation layer 169, the concentration of oxygen in the silicon-containing passivation layer 169 has a gradient, in some embodiments. For example, when measured along a thickness direction (e.g., a direction that is perpendicular to sidewalls of the nanostructures 66) of the silicon-containing passivation layer 169, the surface portions (e.g., exterior portions exposed to ambient) of the silicon-containing passivation layer 169 have the highest concentration of oxygen, and the interior portions (e.g., portions contacting the work function layer 168) have the lowest concentration of oxygen. In other words, the concentration of oxygen (e.g., atomic percentage of oxygen) in the silicon-containing passivation layer 169 decreases along the thickness direction toward the work function layer 168. In some embodiments, the concentration of oxygen is zero at the interface between the silicon-containing passivation layer 169 and the work function layer 168. In other words, the interior portions of the silicon-containing passivation layer 169 (e.g., at the interface between the silicon-containing passivation layer 169 and the work function layer 168) may be the initially formed silicon material and are fee of oxygen.

In some embodiments, the treatment process to form the silicon-containing passivation layer 169 is performed at a temperature between about 200° C. and about 500° C. A pressure of the treatment process is between about 3 torr and about 10 torr, and a duration of the treatment process is between about 60 seconds and about 600 seconds, in some embodiments. A thickness of the silicon-containing passivation layer 169 is less than 1 nm, such as between about 0.5 nm and about 1 nm, as an example. The treatment process may be an in-situ process or an ex-situ process performed after forming the work function layer 168. The treatment process may be performed in an ALD tool or a CVD tool, e.g., a tool used to form the work function layer 168. In the illustrated embodiment, the silicon-containing passivation layer 169 fills (e.g., completely fills) the gaps between vertically adjacent nanostructures 66, and the gaps between the nanostructures 66 and the fins 62.

Figure 9:
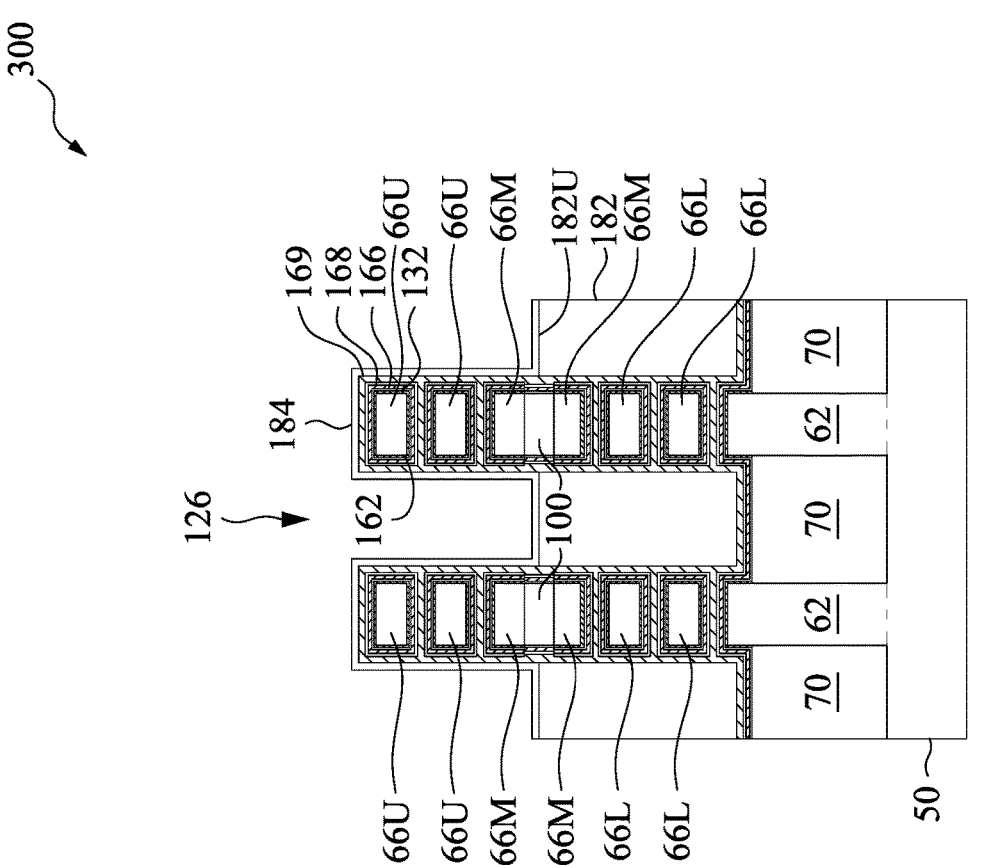

Next, in FIG. 9, a dummy fill material 182 is formed to fill lower portions of the recesses 126. The dummy fill material 182 is formed of a dielectric material, such as an SiOC-based material, where the atomic percentage (at %) of carbon in the SiOC-based material is between about 0 at % and about 10 at %, and the atomic percentage of oxygen in the SiOC-based material is between about 0 at % and about 50 at %. The dummy fill material 182 may be formed using a suitable formation method such as CVD, PECVD, FCVD, or the like. The dummy fill material 182 may be formed to completely fill the recesses 126 first, then an etch-back process is performed to recess the upper surface 182U of dummy fill material 182. In some embodiments, after the recessing, the upper surface 182U of the dummy fill material 182 is between the upper surface and the lower surface of the isolation structure 100. In other words, the dummy fill material 182 covers lower portions of the passivation layer 169 and exposes upper portions of the passivation layer 169.

Next, a dummy liner layer 184 is formed (e.g., conformally) over the dummy fill material 182 and along the upper portions of the passivation layer 169 (e.g., portions of the passivation layer 169 disposed above the upper surface 182U of the dummy fill material 182). The dummy liner layer 184 is formed of a material (e.g., a dielectric material) having a high etching selectivity to the dummy fill material 182. In some embodiments, the dummy liner layer 184 is formed of a metal oxide, such as aluminum oxide or titanium oxide. A suitable deposition process, such as PVD, CVD, PECVD, ALD, or the like, may be used to form the dummy liner layer 184.

Figure 10:
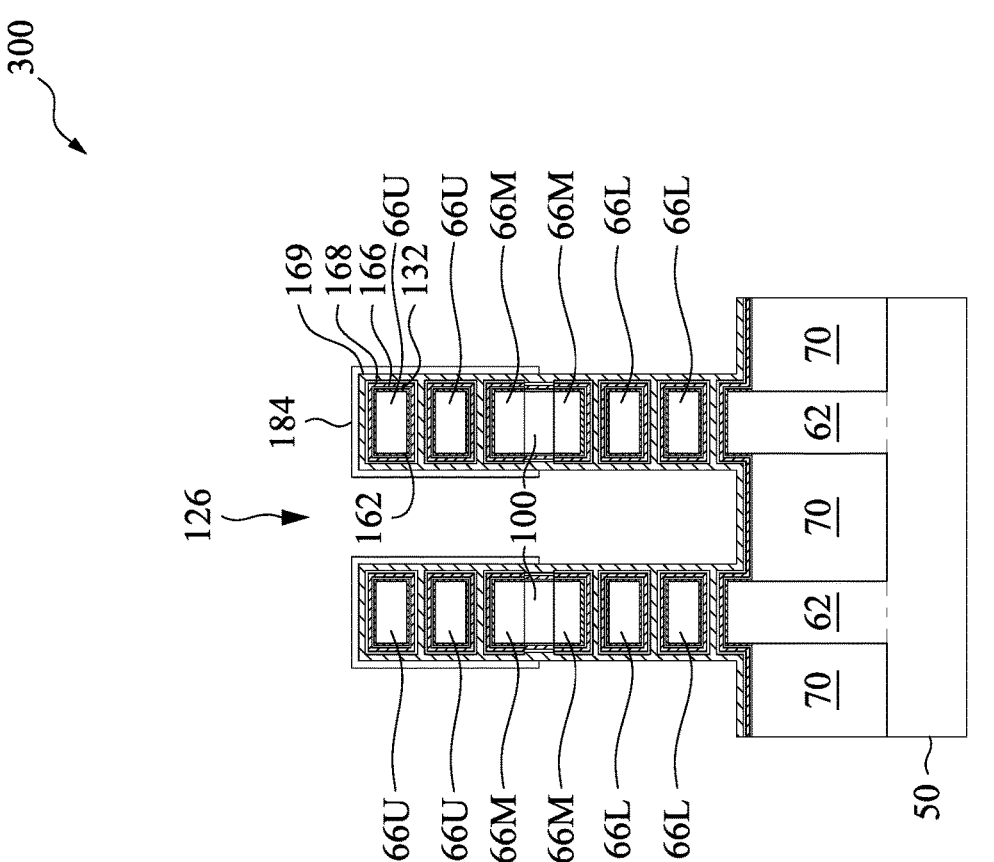

Next, in FIG. 10, the dummy fill material 182 is removed to expose the lower portions of the passivation layer 169 disposed under the upper surface 182U (see FIG. 9) of the dummy fill material 182. In the illustrated embodiment, portions of the dummy liner layer 184 along the upper surface 182U of the dummy fill material 182 is also removed. In some embodiments, etching masks (not illustrated) are formed over (e.g., directly over) the nanostructures 66 to cover (e.g., protect) the nanostructures 66 from the subsequent etching process(es). A first etching process, which is an anisotropic etching process, is performed to remove the portions of the dummy liner layer 184 along the upper surface 182U of the dummy fill material 182. Next, a second etching process, which is a selective etching process using an etchant that is selective to (e.g., having a higher etching rate for) the dummy fill material 182, is performed to remove the dummy fill material 182 without substantially attacking other materials. The second etching process may be anisotropic or isotropic. In other embodiments, a single anisotropic etching process is performed using the etching masks to remove both the dummy fill material 182 and the portions of the dummy liner layer 184 along the upper surface 182U of the dummy fill material 182. After the removal of the dummy fill material 182, the dummy liner layer 184 covers the upper portions of the passivation layer 169 and exposes the lower portions of the passivation layer 169.

Figure 11:
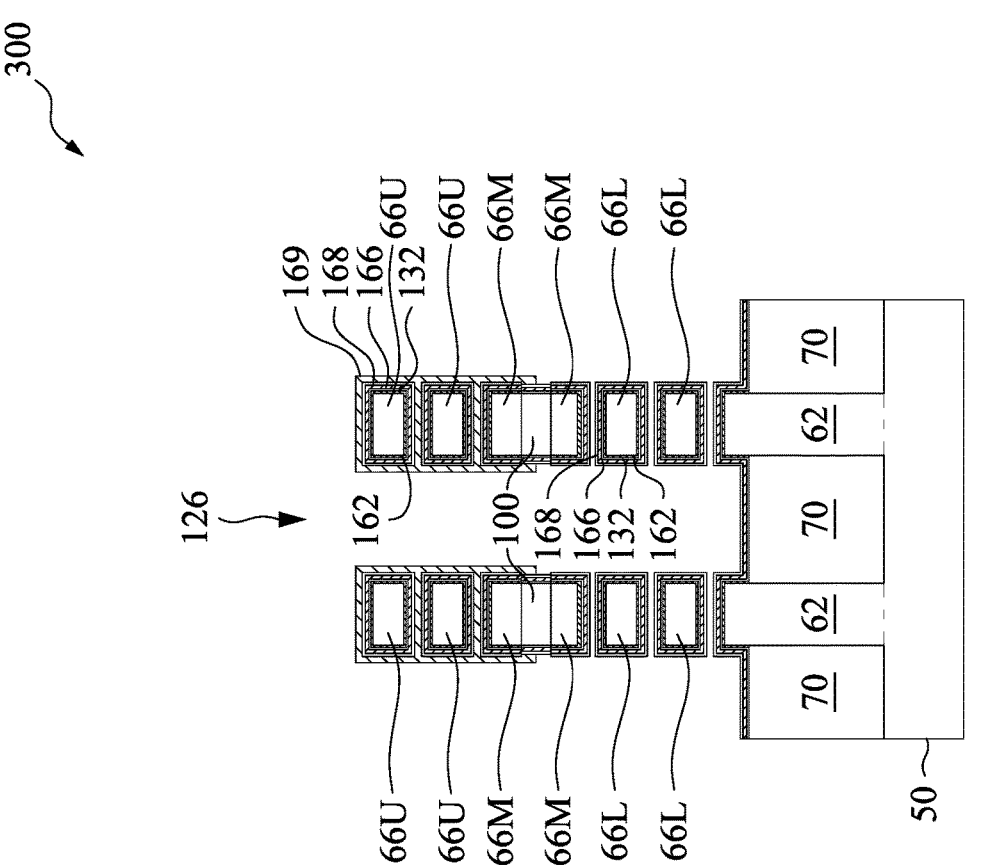

Next, in FIG. 11, the exposed lower portions of the passivation layer 169 (e.g., portions not covered by the dummy liner layer 184) are removed, and subsequently, the dummy liner layer 184 is removed.

In some embodiments, an etching process using an etchant that is selective to (e.g., having a higher etching rate for) the passivation layer 169 is performed to remove the exposed lower portions of the passivation layer 169 without substantially attacking other materials. The etching process may be isotropic. Next, another etching process using an etchant that is selective to (e.g., having a higher etching rate for) the dummy liner layer 184 is performed to remove the dummy liner layer 184 without substantially attacking other materials. The etching process used to remove the dummy liner layer 184 may be an isotropic etching process.

After the exposed lower portions of the passivation layer 169 and the dummy liner layer 184 are removed, nanostructures 66L/66M below the isolation structures 100 are surrounded by the work function layer 168 (e.g., a p-type work function layer), and the nanostructures 66U/66M above the isolation structures 100 are surrounded by the work function layer 168 and the upper portions of the passivation layer 169. In the example of FIG. 11, the lower nanostructure-FET to be formed in the CFET device 300 is a p-type transistor, and the work function layer 168 (e.g., a p-type work function layer) is the work function tuning layer for the p-type transistor; the upper nanostructure-FET to be formed in the CFET device 300 is an n-type transistor, and the work function layer 168 (e.g., a p-type work function layer) and the passivation layer 169 (e.g., a silicon-containing passivation layer) together function as the work function tuning layer for the n-type transistor to tune the threshold voltage $V_t$ of the n-type transistor.

Figure 12A:
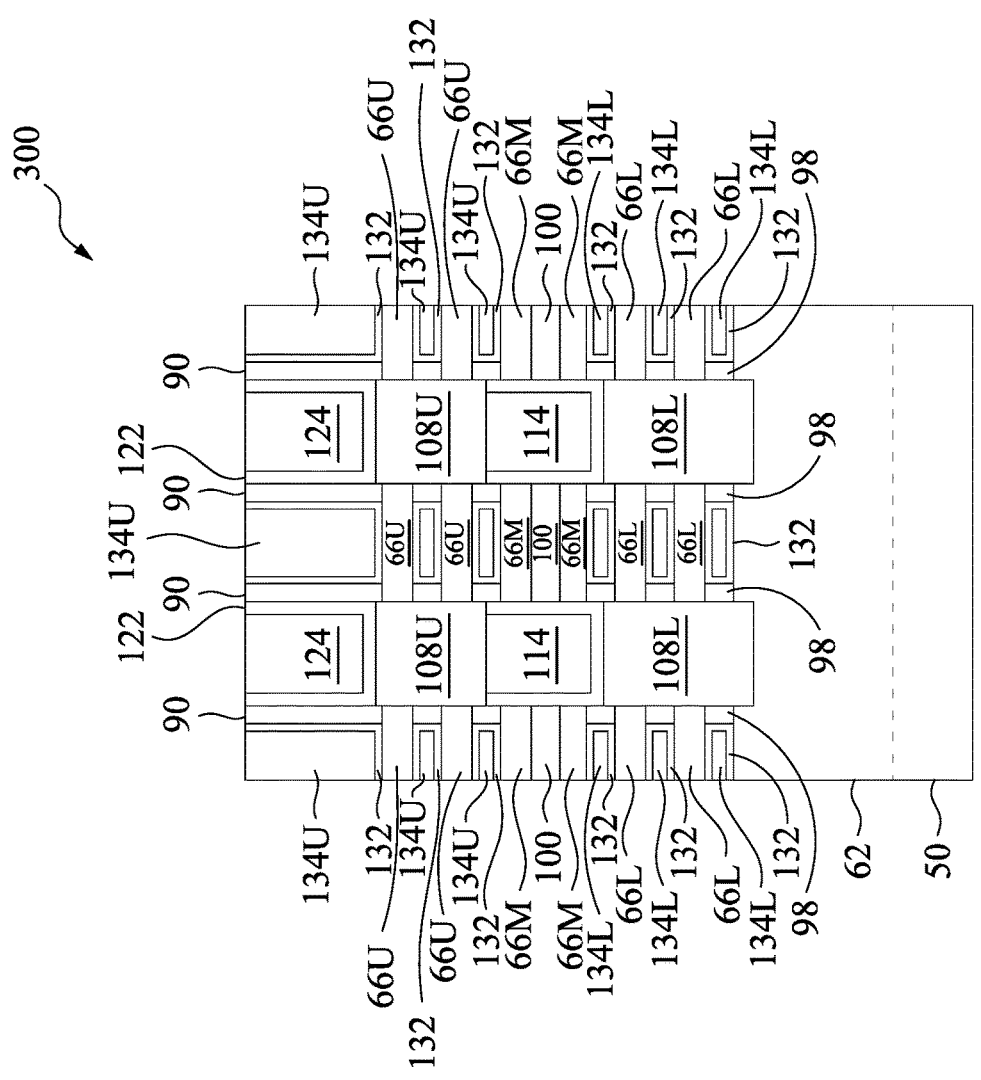
Figure 12B:
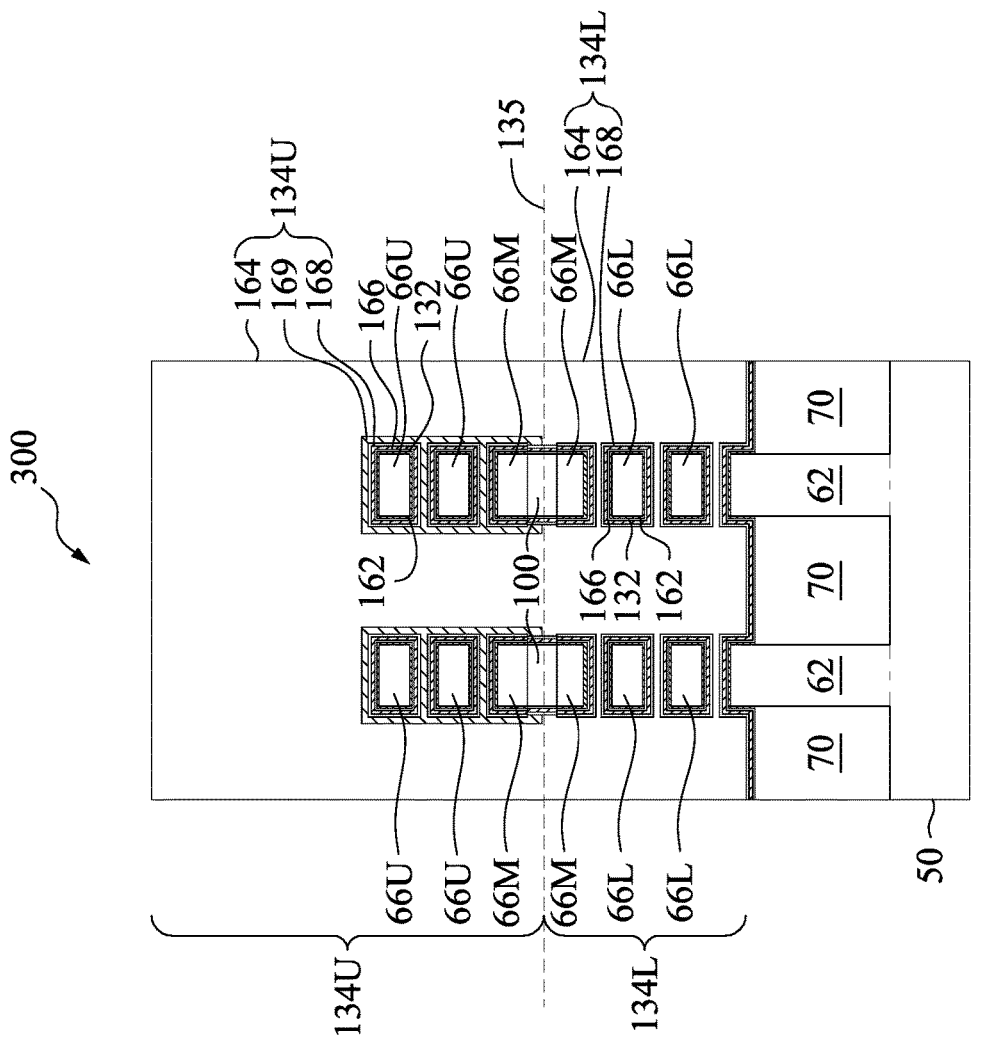

Next, as illustrated in FIG. 12B, a gate fill material 164 is formed in the recesses 126 to fill (e.g., completely fill) or overfill the recesses 126. A planarization process, such as CMP, may be performed to remove excess portions of the gate fill material 164, which excess portions are disposed over the upper surface of the second ILD 124 and over the upper surfaces of the gate spacers 90. After the planarization process, the remaining portions of the gate fill material 164 below the dashed line 135 and the work function layer 168 below the dashed line 135 may be collectively referred to as the lower gate electrode 134L of the lower nanostructure-FET; the remaining portions of the gate fill material 164 above the dashed line 135, the work function layer 168 above the dashed line 135, and the passivation layer 169 may be collectively referred to as the upper gate electrode 134U of the upper nanostructure-FET. The dashed line 135 is between the upper surface and the lower surface of the isolation structure 100, and is used as a conceptual delineation between the upper gate electrode 134U and the lower gate electrode 134L, with the understanding that the gate fill material 164 extends continuously without an interface from the upper gate electrode 134U to the lower gate electrode 134L. The interfacial layer 162 (if formed), the gate dielectric layer 132 (also referred to as gate dielectric layer), the capping layer 166 (if formed), and the corresponding gate electrode 134 (including the upper gate electrode 134U and/or the lower gate electrode 134L) may be collectively referred to as a "gate structure" of the CFET device 300.

FIG. 12A illustrates the CFET device 300 of FIG. 12B, but along cross-section A-A'. Note that for simplicity and to avoid cluttering, in FIG. 12A, the details (e.g., sublayers) of the upper gate electrode 134U and the lower gate electrode 134L are not illustrated. In addition, the interfacial layer 162 and the capping layer 166 are not illustrated, with the understanding that these layers may be formed, as illustrated in FIG. 12B.

In some embodiments, the gate fill material 164 is a metal-containing electrically conductive material such as tungsten, titanium, titanium nitride, tantalum, tantalum nitride, tantalum carbide, aluminum, ruthenium, cobalt, combinations thereof, multi-layers thereof, or the like. A suitable formation method, such as CVD, PVD, PECVD, or the like, may be used to form the gate fill material 164.

Note that in FIG. 12B, the gate fill material 164 extends continuously from the upper gate electrode 134U to the lower gate electrode 134L, e.g., extends continuously from the uppermost surface of the nanostructures 66 (e.g., the upper surface of the uppermost nanostructure 66U) to a lowermost surface of the nanostructures 66 (e.g., the lower surface of the lowest nanostructure 66L). In particular, there is no dielectric layer formed between, and separating, the upper gate electrode 134U and the lower gate electrode 134L. The upper gate electrode 134U and the lower gate electrode 134L may be collectively referred to as a common metal gate of the CFET device 300. In the example of FIG. 12B, the gate fill material 164 contacts (e.g., physically contacts) the silicon-containing passivation layer 169 of the upper gate electrode 134U, and contacts (e.g., physically contacts) the work function layer 168 of the lower gate electrode 134L.

The method for forming the common metal gate disclose above have many advantages. For example, a conventional n-type metal gate often needs a thick (e.g., thicker than 3 nm) n-type work function tuning layer (e.g., TiAl) with an additional capping layer (which may be about 1 nm thick) to provide a sufficiently low work function for the n-type metal gate. The thick n-type work function tuning layer and the capping layer may increase the size of the metal gate, which reduces integration density and increases device cost. In contrast, the disclosed method herein uses a thin work function layer 168 (e.g., a p-type work function tuning material) and the passivation layer 169 as the work function tuning layer of the n-type metal gate, which reduces the thickness of the work function layer in the n-type metal gate, thus avoiding the above discussed issues. In addition, by using a dual-layered structure for the work function tuning material (e.g., 168 and 169) of the n-type metal gate, better threshold tuning capability of the n-type metal gate is achieved.

Another advantage of the disclosed method herein is that the upper gate electrode 134U and the lower gate electrode 134L are formed without the need to remove and replace the upper metal gate. To appreciate the advantage, consider a reference method, where after the processing of FIGS. 7A and 7B, a first type (e.g., p-type) of metal gate is formed in both the upper nanostructure-FET and the lower nanostructure-FET. The gate electrode of the upper nanostructure-FET is then removed, e.g., by an etching process. Next, a dielectric layer is formed on the upper surface of the gate electrode of the lower nanostructure-FET to isolate the lower gate electrode from the subsequently formed upper gate electrode. After the dielectric layer is formed, a second type (e.g., n-type) of gate is formed for the upper nanostructure-FET. In the reference method, the etching process to remove the gate electrode of the upper nanostructure-FET may damage the underlying structure (e.g., the gate of the lower nanostructure-FET), and may cause device failure. The disclosed method for forming the common metal gate obviates the need to remove the gate electrode of the upper nanostructure-FET, thus avoiding the damage to the device. The disclosed method also reduces the manufacturing time and cost, due to simpler and less processing steps.

Additional processing may be performed after the processing of FIGS. 12A and 12B to complete fabrication of the CFET device 300, as skilled artisans readily appreciate. For example, source/drain contact plugs, gate contact plugs, and interconnect structures may be formed to interconnect the electrical components formed and to form functional circuits. Details are not discussed here.

Figure 13:
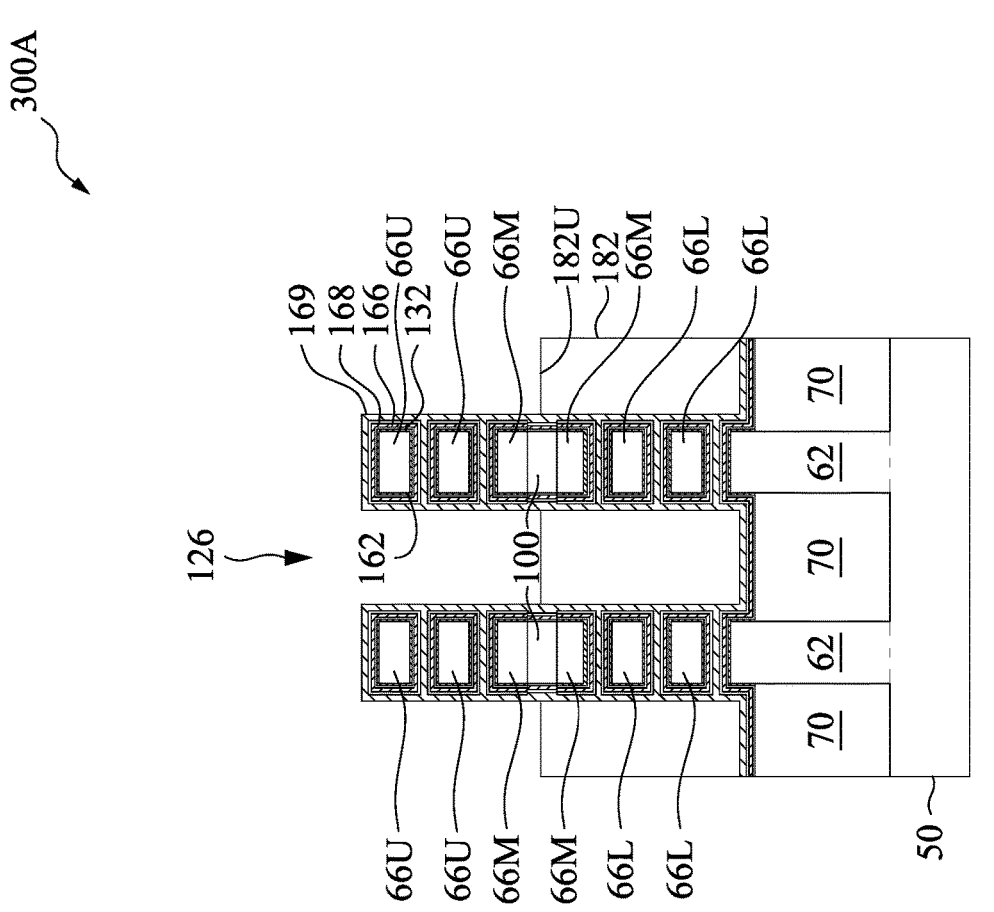
FIGS. 13-15 are cross-sectional views of a CFET device at various stages of manufacturing, in accordance with another embodiment.
Figure 14:
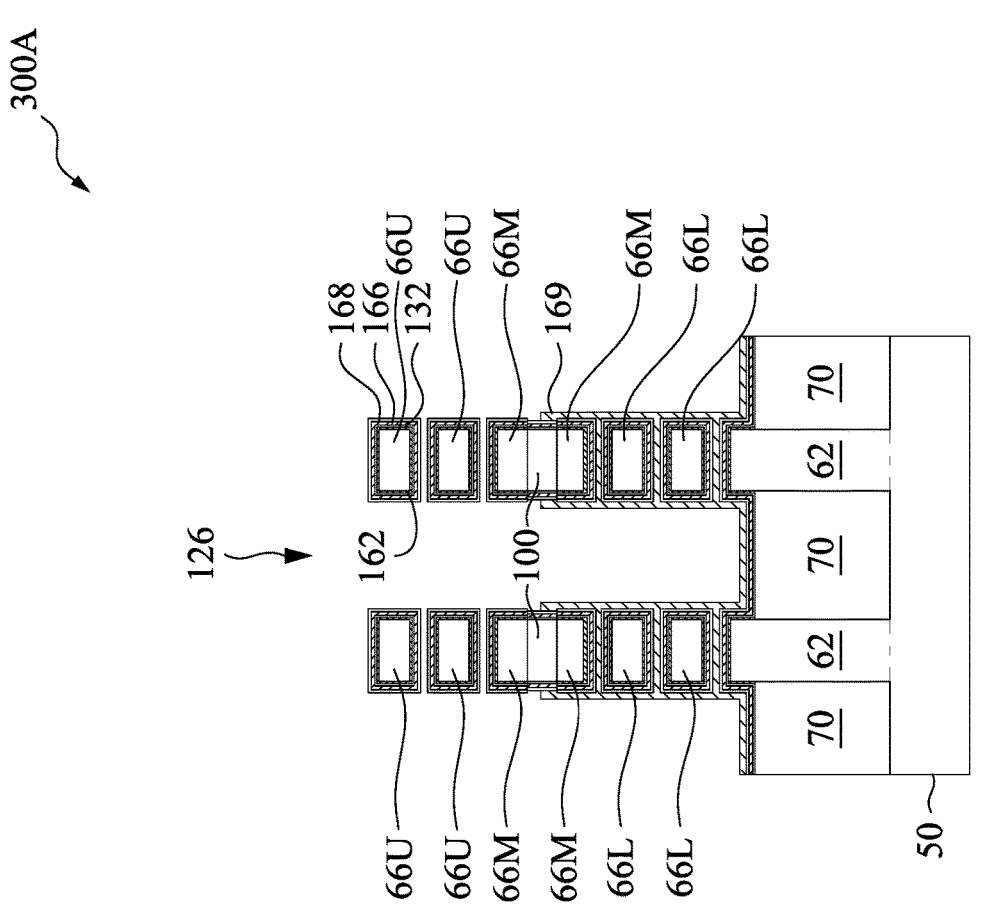
Figure 15:
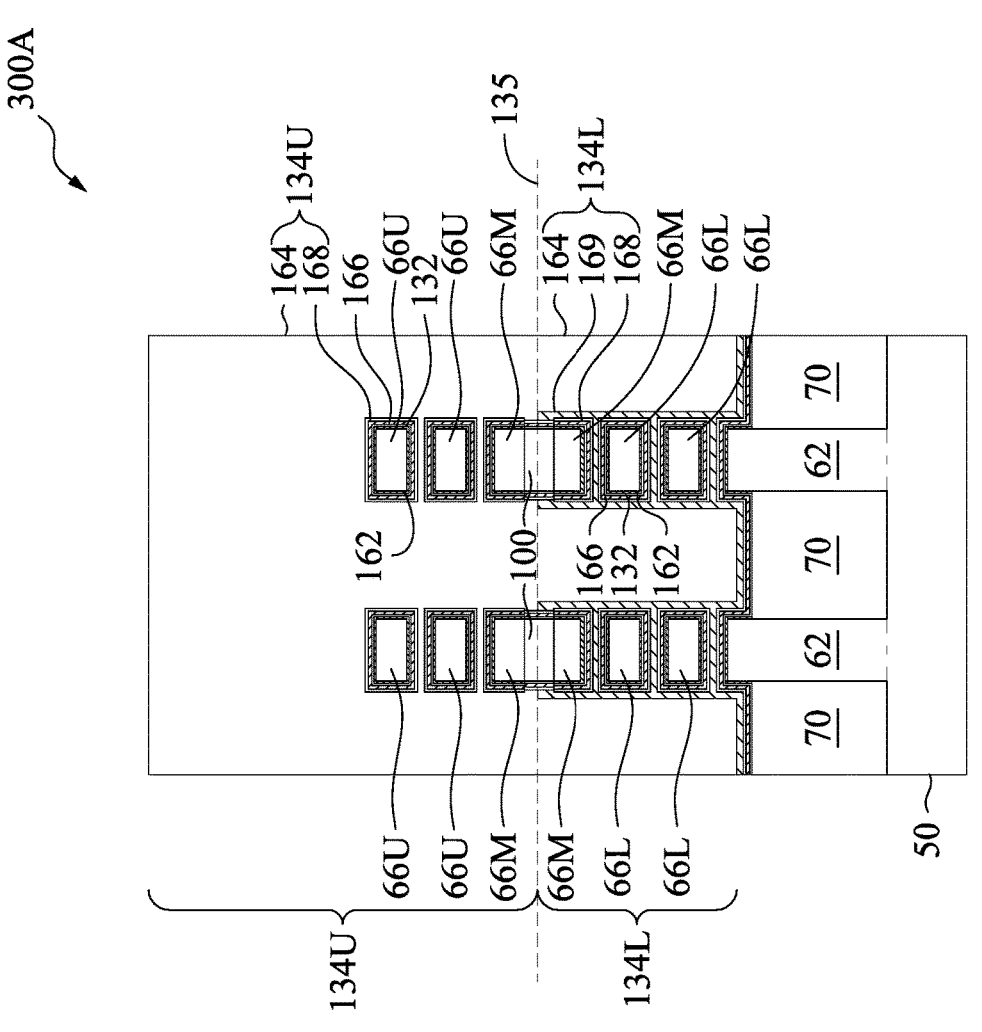

FIGS. 13-15 illustrates a CFET device 300A at various stages of manufacturing, in accordance with another embodiment. The processing of FIGS. 13-15 may replace the processing of FIGS. 9-11, 12A, and 12B. In other words, FIGS. 2-8 and 13-15 illustrate various processing steps for fabricating the CFET device 300A.

The processing of FIG. 13 follows the processing of FIG. 8. In FIG. 13, the dummy fill material 182 is formed over the passivation layer 169. The dummy fill material 182 may be formed to completely fill the recesses 126 first, then an etch-back process is performed to recess the upper surface 182U of dummy fill material 182. In some embodiments, after the recessing, the upper surface 182U of the dummy fill material 182 is between the upper surface and the lower surface of the isolation structure 100. In other words, the dummy fill material 182 covers lower portions of the passivation layer 169 and exposes upper portions of the passivation layer 169.

Next, in FIG. 14, a selective etching process is performed using an etchant that is selective to (e.g., having a higher etching rate for) the passivation layer 169, such that the exposed upper portions of the passivation layer 169 are removed without substantially attacking other materials. Next, the dummy fill material 182 is removed, e.g., by a selective etching process performed using an etchant that is selective to (e.g., having a higher etching rate for) the dummy fill material 182. After the dummy fill material 182 is removed, the work function layer 168 around the nanostructures 66U/66M that are disposed above the isolation structure 100 are exposed, and the work function layer 168 around the nanostructures 66L/66M that are disposed below the isolation structure 100 are covered by the lower portions of the passivation layer 169.

Next, in FIG. 15, the gate fill material 164 is formed in the recesses 126 to fill (e.g., completely fill) or overfill the recesses 126. A planarization process, such as CMP, may be performed to remove excess portions of the gate fill material 164, which excess portions are disposed over the upper surface of the second ILD 124 and over the upper surfaces of the gate spacers 90. After the planarization process, the remaining portions of the gate fill material 164 above the dashed line 135 and the work function layer 168 above the dashed line 135 may be collectively referred to as the upper gate electrode 134U of the upper nanostructure-FET; the remaining portions of the gate fill material 164 below the dashed line 135, the work function layer 168 below the dashed line 135, and the passivation layer 169 may be collectively referred to as the lower gate electrode 134L of the lower nanostructure-FET. The dashed line 135 is between the upper surface and the lower surface of the isolation structure 100, and is used as a conceptual delineation between the upper gate electrode 134U and the lower gate electrode 134L.

Note that in the example of FIG. 15, the upper nanostructure-FFT is a p-type FET, and the lower nanostructure-FET is an n-type FET. The work function layer 168 below the dashed line 135 and the passivation layer 169 together function as the work function tuning materials of the lower gate electrode 134L of the lower nanostructure-FET.

FIG. 15 shows the cross-sectional view of the CFET device 300A along the cross-section B-B' of FIG. 1. The corresponding cross-sectional view of the CFET device 300A along the cross-section A-A' of FIG. 1 is the same as or similar to FIG. 12A, details are not repeated here. Note that as discussed above, the upper gate electrode 134U and the lower gate electrode 134L of the CFET device 300A each comprises different sublayers of materials from the upper gate electrode 134U and the lower gate electrode 134L of the CFET device 300.

Embodiments may achieve advantages. The disclosed method, by using the work function layer 168 and the passivation layer 169 as the work function tuning material of the n-type FET, obviates the need to form a thick n-type work function tuning layer for the n-type FET, thus improving integration density and reducing device cost. In addition, the disclosed method does not need the processing steps to remove and replace the upper gate electrode, thus simplifying the manufacturing process, reducing cost, and avoiding device damage caused by the etching process used to remove the upper gate electrode.

FIG. 16 is a flow chart of a method 1000 of forming a CFET device, in accordance with some embodiments. It should be understood that the embodiment method shown in FIG. 16 is merely an example of many possible embodiment methods. One of ordinary skill in the art would recognize many variations, alternatives, and modifications. For example, various steps as illustrated in FIG. 16 may be added, removed, replaced, rearranged, or repeated.

Referring to FIG. 16, at block 1010, a plurality of channel regions are formed to stack vertically over a fin. At block 1020, an isolation structure is formed between a first subset of the plurality of channel regions and a second subset of the plurality of channel regions. At block 1030, a gate dielectric material is formed around the plurality of channel regions and the isolation structure. At block 1040, a work function material is formed around the gate dielectric material. At block 1050, a silicon-containing passivation layer is formed around the work function material. At block 1060, after forming the silicon-containing passivation layer, a first portion of the silicon-containing passivation layer disposed around the first subset of the plurality of channel regions is removed, and a second portion of the silicon-containing passivation layer disposed around the second subset of the plurality of channel regions is kept. At block 1070, after removing the first portion of the silicon-containing passivation layer, a gate fill material is formed around the plurality of channel regions.

In an embodiment, a method of forming a complementary field-effect transistor (CFET) device includes: forming a plurality of channel regions stacked vertically over a fin; forming an isolation structure between a first subset of the plurality of channel regions and a second subset of the plurality of channel regions; forming a gate dielectric material around the plurality of channel regions and the isolation structure; forming a work function material around the gate dielectric material; forming a silicon-containing passivation layer around the work function material; after forming the silicon-containing passivation layer, removing a first portion of the silicon-containing passivation layer disposed around the first subset of the plurality of channel regions and keeping a second portion of the silicon-containing passivation layer disposed around the second subset of the plurality of channel regions; and after removing the first portion of the silicon-containing passivation layer, forming a gate fill material around the plurality of channel regions. In an embodiment, the gate fill material is formed of an electrically conductive material, wherein the gate fill material extends continuously from an uppermost surface of the plurality of channel regions facing away from the fin to a lowermost surface of the plurality of channel regions facing the fin. In an embodiment, the gate fill material contacts the silicon-containing passivation layer disposed around the second subset of the plurality of channel regions, and contacts the work function material around the first subset of the plurality of channel regions. In an embodiment, the method further includes: forming first source/drain regions on opposing ends of the first subset of the plurality of channel regions; forming second source/drain regions on opposing ends of the second subset of the plurality of channel regions, wherein the first source/drain regions and the second source/drain regions are different types of source/drain regions; and forming a dielectric layer between, and separating, the first source/drain regions and the second source/drain regions. In an embodiment, the work function material is a p-type work function material, wherein the first source/drain regions are p-type source/drain regions, and the second source/drain regions are n-type source/drain regions. In an embodiment, forming the silicon-containing passivation layer comprises treating the work function material with a silicon-containing gas. In an embodiment, treating the work function material comprises performing a thermal process or a plasma process using the silicon-containing gas to treat the work function material. In an embodiment, the second subset of the plurality of channel regions is between the first subset of the plurality of channel regions and the fin. In an embodiment, removing the first portion of the silicon-containing passivation layer comprises: forming a dummy fill material to cover the second portion of the silicon-containing passivation layer around the second subset of the plurality of channel regions, wherein the first portion of the silicon-containing passivation layer around the first subset of the plurality of channel regions is exposed by the dummy fill material; after forming the dummy fill material, removing the exposed first portion of the silicon-containing passivation layer; and after removing the exposed first portion of the silicon-containing passivation layer, removing the dummy fill material. In an embodiment, the first subset of the plurality of channel regions is between the second subset of the plurality of channel regions and the fin. In an embodiment, removing the first portion of the silicon-containing passivation layer comprises: forming a dummy fill material to cover the first portion of the silicon-containing passivation layer around the first subset of the plurality of channel regions, wherein the second portion of the silicon-containing passivation layer around the second subset of the plurality of channel regions is exposed by the dummy fill material; after forming the dummy fill material, forming a dummy liner layer over the dummy fill material, wherein the dummy liner layer is formed to cover the second portion of the silicon-containing passivation layer; after forming the dummy liner layer, removing the dummy fill material to expose the first portion of the silicon-containing passivation layer; after removing the dummy fill material, selectively removing the first portion of the silicon-containing passivation layer using the dummy liner layer as an etching mask; and after removing the first portion of the silicon-containing passivation layer, removing the dummy liner layer.

In an embodiment, a method of forming a complementary field-effect transistor (CFET) device, the method includes: forming a fin protruding above a substrate; forming a first plurality of channel regions and a second plurality of channel regions over the fin, wherein the first plurality of channel regions and the second plurality of channel regions are aligned along a vertical direction perpendicular to a major upper surface of the substrate; forming a gate dielectric layer around the first plurality of channel regions and the second plurality of channel regions; forming a work function layer around the gate dielectric layer; forming a passivation layer around the work function layer using a silicon-containing gas; after forming the passivation layer, covering a second portion of the passivation layer disposed around the second plurality of channel regions using a sacrificial material, wherein a first portion of the passivation layer disposed around the first plurality of channel regions is exposed by the sacrificial material; removing the exposed first portion of the passivation layer; and after removing the exposed first portion of the passivation layer, forming a gate fill material around the first plurality of channel regions and the second plurality of channel regions. In an embodiment, the work function layer is a p-type work function layer. In an embodiment, the method further includes: forming p-type source/drain regions on opposing ends of the first plurality of channel regions; and forming n-type source/drain regions on opposing ends of the second plurality of channel regions, wherein the p-type source/drain regions and the n-type source/drain regions are aligned along the vertical direction.

In an embodiment, the first plurality of channel regions is disposed between the second plurality of channel regions and the fin. In an embodiment, the method further includes: forming inner spacers between adjacent ones of the first plurality of channel regions and between adjacent ones of the second plurality of channel regions; and forming an isolation structure between the first plurality of channel regions and the second plurality of channel regions.

In an embodiment, a complementary field-effect transistor (CFET) device includes: a fin protruding above a substrate; p-type source/drain regions over the fin; first channel regions between the p-type source/drain regions; n-type source/drain regions over the fin; second channel regions between the n-type source/drain regions; and a gate structure over the fin, around the first channel regions, and around the second channel regions, comprising: a gate dielectric material around the first channel regions and the second channel regions; a work function material around the gate dielectric material; a silicon-containing passivation layer covering the work function material around the second channel regions, wherein the work function material around the first channel regions is exposed by the silicon-containing passivation layer; and a gate fill material around the first channel regions and the second channel regions, wherein the gate fill material extends continuously from the first channel regions to the second channel regions. In an embodiment, the p-type source/drain regions and the n-type source/drain regions are stacked along a vertical direction perpendicular to a major upper surface of the substrate. In an embodiment, the gate fill material contacts the silicon-containing passivation layer and contacts the work function material around the first channel regions. In an embodiment, the first channel regions are between the second channel regions and the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a complementary field-effect transistor (CFET) device, the method comprising:
   forming a fin protruding above a substrate;
   forming a plurality of channel regions stacked vertically over the fin;
   forming an isolation structure between a first subset of the plurality of channel regions and a second subset of the plurality of channel regions;
   forming a gate dielectric material around the plurality of channel regions and the isolation structure;
   forming a work function material around the gate dielectric material;
   forming a silicon-containing passivation layer around the work function material;
   after forming the silicon-containing passivation layer, removing a first portion of the silicon-containing passivation layer disposed around the first subset of the plurality of channel regions and keeping a second portion of the silicon-containing passivation layer disposed around the second subset of the plurality of channel regions; and after removing the first portion of the silicon-containing passivation layer, forming a gate fill material around the plurality of channel regions.

2. The method of claim 1, wherein the gate fill material is formed of an electrically conductive material, wherein the gate fill material extends continuously from an uppermost surface of the plurality of channel regions facing away from the fin to a lowermost surface of the plurality of channel regions facing the fin.

3. The method of claim 2, wherein the gate fill material contacts the silicon-containing passivation layer disposed around the second subset of the plurality of channel regions, and contacts the work function material around the first subset of the plurality of channel regions.

4. The method of claim 1, further comprising:

forming first source/drain regions on opposing ends of the first subset of the plurality of channel regions;

forming second source/drain regions on opposing ends of the second subset of the plurality of channel regions, wherein the first source/drain regions and the second source/drain regions are different types of source/drain regions; and forming a dielectric layer between, and separating, the first source/drain regions and the second source/drain regions.

5. The method of claim 4, wherein the work function material is a p-type work function material, wherein the first source/drain regions are p-type source/drain regions, and the second source/drain regions are n-type source/drain regions.

6. The method of claim 1, wherein forming the silicon-containing passivation layer comprises treating the work function material with a silicon-containing gas.

7. The method of claim 6, wherein treating the work function material comprises performing a thermal process or a plasma process using the silicon-containing gas to treat the work function material.

8. The method of claim 1, wherein the second subset of the plurality of channel regions is between the first subset of the plurality of channel regions and the fin.

9. The method of claim 8, wherein removing the first portion of the silicon-containing passivation layer comprises:

forming a dummy fill material to cover the second portion of the silicon-containing passivation layer around the second subset of the plurality of channel regions, wherein the first portion of the silicon-containing passivation layer around the first subset of the plurality of channel regions is exposed by the dummy fill material;

after forming the dummy fill material, removing the exposed first portion of the silicon-containing passivation layer; and after removing the exposed first portion of the silicon-containing passivation layer, removing the dummy fill material.

10. The method of claim 1, wherein the first subset of the plurality of channel regions is between the second subset of the plurality of channel regions and the fin.

11. The method of claim 10, wherein removing the first portion of the silicon-containing passivation layer comprises:

forming a dummy fill material to cover the first portion of the silicon-containing passivation layer around the first subset of the plurality of channel regions, wherein the second portion of the silicon-containing passivation layer around the second subset of the plurality of channel regions is exposed by the dummy fill material;

after forming the dummy fill material, forming a dummy liner layer over the dummy fill material, wherein the dummy liner layer is formed to cover the second portion of the silicon-containing passivation layer;

after forming the dummy liner layer, removing the dummy fill material to expose the first portion of the silicon-containing passivation layer;

after removing the dummy fill material, selectively removing the first portion of the silicon-containing passivation layer using the dummy liner layer as an etching mask; and after removing the first portion of the silicon-containing passivation layer, removing the dummy liner layer.

12. A method of forming a complementary field-effect transistor (CFET) device, the method comprising:

forming a fin protruding above a substrate;

forming a first plurality of channel regions and a second plurality of channel regions over the fin, wherein the first plurality of channel regions and the second plurality of channel regions are aligned along a vertical direction perpendicular to a major upper surface of the substrate;

forming a gate dielectric layer around the first plurality of channel regions and the second plurality of channel regions;

forming a work function layer around the gate dielectric layer;

forming a passivation layer around the work function layer using a silicon-containing gas;

after forming the passivation layer, covering a second portion of the passivation layer disposed around the second plurality of channel regions using a sacrificial material, wherein a first portion of the passivation layer disposed around the first plurality of channel regions is exposed by the sacrificial material;

removing the exposed first portion of the passivation layer; and after removing the exposed first portion of the passivation layer, forming a gate fill material around the first plurality of channel regions and the second plurality of channel regions.

13. The method of claim 12, wherein the work function layer is a p-type work function layer.

14. The method of claim 13, further comprising:

forming p-type source/drain regions on opposing ends of the first plurality of channel regions; and forming n-type source/drain regions on opposing ends of the second plurality of channel regions, wherein the p-type source/drain regions and the n-type source/drain regions are aligned along the vertical direction.

15. The method of claim 12, wherein the first plurality of channel regions is disposed between the second plurality of channel regions and the fin.

16. The method of claim 12, further comprising:

forming inner spacers between adjacent ones of the first plurality of channel regions and between adjacent ones of the second plurality of channel regions; and forming an isolation structure between the first plurality of channel regions and the second plurality of channel regions.

17. A method of forming a complementary field-effect transistor (CFET) device, the method comprising:

forming a fin protruding above a substrate;

forming a plurality of channel regions stacked vertically over the fin, wherein the plurality of channel regions comprise a first subset of channel regions and a second subset of channel regions;

forming an isolation structure between the first subset of channel regions and the second subset of channel regions;

forming a gate dielectric material around the plurality of channel regions and the isolation structure;

forming a work function material around the gate dielectric material;

forming a silicon-containing passivation layer around the work function material, wherein a first portion of the silicon-containing passivation layer is formed around the first subset of channel regions, and a second portion of the silicon-containing passivation layer is formed around the second subset of channel regions;

after forming the silicon-containing passivation layer, removing the first portion of the silicon-containing passivation layer while keeping the second portion of the silicon-containing passivation layer; and after removing the first portion of the silicon-containing passivation layer, forming a gate fill material around the plurality of channel regions.

18. The method of claim 17, wherein forming the silicon-containing passivation layer comprises treating the work function material with a silicon-containing gas.

19. The method of claim 17, wherein the work function material is a p-type work function material.

20. The method of claim 19, further comprising:

forming p-type source/drain regions on opposing ends of the first subset of channel regions;

forming n-type source/drain regions on opposing ends of the second subset of channel regions; and forming a dielectric layer between, and separating, the p-type source/drain regions and the n-type source/drain regions.

* * * * *